(12) United States Patent
Mallinson

(10) Patent No.: US 11,271,535 B2
(45) Date of Patent: Mar. 8, 2022

(54) ANALOG COMPUTER WITH VARIABLE GAIN

(71) Applicant: SiliconIntervention Inc., Kelowna (CA)

(72) Inventor: A. Martin Mallinson, Kelowna (CA)

(73) Assignee: SiliconIntervention Inc., Kelowna (CA)

( * ) Notice: Subject to any disclaimer, the term of this patent is extended or adjusted under 35 U.S.C. 154(b) by 76 days.

(21) Appl. No.: 16/803,959

(22) Filed: Feb. 27, 2020

(65) Prior Publication Data

US 2020/0280292 A1 Sep. 3, 2020

Related U.S. Application Data

(60) Provisional application No. 62/812,202, filed on Feb. 28, 2019.

(51) Int. Cl.
*H03F 3/45* (2006.01)
*H03G 3/30* (2006.01)
*H03F 3/16* (2006.01)

(52) U.S. Cl.
CPC ............... *H03G 3/30* (2013.01); *H03F 3/16* (2013.01); *H03G 2201/103* (2013.01)

(58) Field of Classification Search
CPC ............... H03F 3/45; H03F 3/72; H03G 3/30
USPC .................................. 330/51, 254; 327/334
See application file for complete search history.

(56) References Cited

U.S. PATENT DOCUMENTS

| 3,167,647 | A | | 1/1965 | Newbold | |
|---|---|---|---|---|---|
| 3,293,424 | A | | 12/1966 | Fisher | |
| 3,500,032 | A | * | 3/1970 | Buckley | G06G 7/16 708/843 |
| 3,582,675 | A | * | 6/1971 | Jordan, Jr. | H03F 3/72 327/376 |
| 4,286,226 | A | * | 8/1981 | Leidich | H03G 1/0023 330/254 |
| 5,131,072 | A | | 7/1992 | Yoshizawa et al. | |
| 5,213,077 | A | | 5/1993 | Nishiizawa et al. | |

OTHER PUBLICATIONS

Zheng Tang, O. Ishizuka and H. Matsumoto, "Backpropagation Learning in Analog T-Model Neural Network Hardware," Proceedings of 1993 International Conference on Neural Networks (IJCNN-93-Nagoya, Japan), Nagoya, Japan, 1993, pp. 899-902 vol.1, doi: 10.1109/IJCNN.1993.714056.

* cited by examiner

*Primary Examiner* — Steven J Mottola
(74) *Attorney, Agent, or Firm* — Gard & Kaslow LLP

(57) ABSTRACT

Improved performance of analog computers is obtained by utilizing a deliberate reduction in gain of the gain elements present in the analog computer. While a prior output of the circuit (if any) is present, the gain of the gain elements is reduced to a level that is low enough that the input signal cannot propagate through the circuit. The input signal is then changed to a new value, or set of values, while the gain of the gain elements remains reduced. Finally, the gain of the gain elements is increased to a level that is high enough to allow the input signal to propagate through the circuit, resulting in an output that is a solution to the problem represented by the analog computer.

12 Claims, 17 Drawing Sheets

ANALOG COMPUTER WITH VARIABLE GAIN

This application claims priority from U.S. Provisional Application No. 62/812,202, filed Feb. 28, 2019, which is incorporated by reference herein in its entirety.

FIELD OF THE INVENTION

The present invention relates generally to analog computers, and more particularly to an analog computer having variable gain.

BACKGROUND OF THE INVENTION

An analog computer is a type of computer that uses the continuously changeable aspects of some physical phenomena, such as electrical, mechanical or hydraulic quantities, to model a problem to be solved. Digital computers, by contrast, represent varying quantities symbolically and by discrete values of both time and amplitude. A slide rule is one of the simplest analog computers. While digital computers have replaced analog computers for many applications, some problems are still advantageously solved with analog computers.

The present approach is directed to electrical analog computers, in which a problem is modeled within the electrical domain. Such analog computers are based upon elements having gain, commonly operational amplifiers ("op-amps"), which conventionally have high gain. For example, a solution to a complex equation, such as Schrodinger's equation, may be modeled within the electrical component of an analog computer.

The principle is that the differential Schrodinger's equation, possibly involving time, may be solved by mapping it into its electrical analog, i.e., by using Kirchoff's current law of the circuit equivalently constrained as a solution to the problem. When one or more inputs are applied to the constrained network that is modeling the problem, the analog voltages and currents within the analog computer change as the network arrives at a solution that represents the solution to the problem.

The network of an analog computer may be static, in which the solution is obtained when the electrical parameters converge on a static result, or dynamic, in which the solution is provided by a periodic steady state of the electrical parameters.

One issue that arises with such electrical analog computers is the response of the network to modification of the inputs. When a change is made to the inputs, the analog voltages and currents in the computer must again change in order to solve the problem again, now with the new input parameters. As is known in the art, the time taken to establish the new solution is finite, and depends upon the gain-bandwidth product of the high gain elements, and the feedback (if any) around the high gain elements. This results in a transient state between the "old" solution, i.e., the solution for the prior inputs, and the "new" solution for the new inputs.

This transient state is present in the configuration of gain elements that form an analog computer as it adapts to the new input(s) whether or not the network is static or dynamic. The transient event within a static network is the time taken for electrical parameters to once again converge on the new static result. The transient event in the dynamic network is the time taken to move between the two periodic steady state solutions: that periodic steady state that was the solution of the prior input states, and the new periodic steady state solution of the present input states.

In some instances, the delay of the transient state may be significant. Accordingly, it is desirable to shorten the length of the transient state so that an analog computer may provide a faster solution to a desired problem represented by the computer's network of elements.

SUMMARY OF THE INVENTION

The present application describes an apparatus and method for improving the performance of analog computers.

One embodiment describes a method of operating an analog computer, the analog computer comprising a plurality of gain elements configured to operate on an overall input signal to provide a solution to a predetermined problem, the gain of each of the plurality of gain elements being variable between a level sufficient to propagate a signal input to the element and a level insufficient to propagate the signal input to the element, the method comprising: reducing the gain of each of the plurality of gain elements to the level that is insufficient to propagate the signal input to the gain elements; changing the overall input signal while the gain of the gain elements is at the reduced level; and increasing the gain of each of the plurality of gain elements, at a time not before the changing of the input signal, to the level that is sufficient to propagate the signal input to the gain elements.

Another embodiment describes a variable gain element for use in an analog computer, comprising: first and second transistors, each transistor having a gate, a source and a drain, the gate of the first transistor configured to receive an input signal and the gate of the second transistor connected to a reference point; first and second resistors, the first resistor connected to the drain of the first transistor and to one side of a voltage source, and the second resistor connected to the drain of the second transistor and to the voltage source; a current source connected to the sources of both the first and second transistors, configured to provide different levels of current in response to a control signal; an amplifier having inputs connected to the drains of the first and second transistors and the reference point, and an output providing the output of the gain element; and a control circuit configured to provide a control signal based upon a pre-selected condition.

A further embodiment describes a variable gain element for use in an analog computer, comprising: a first amplifier configured to receive a signal at a first end and produce an amplified signal at a second end; a first resistive element having a first end configured to receive an input signal to the variable gain element, and a second end connected to the first end of the first amplifier; a second resistive element having a first end connected to the first end of the first amplifier and a second end connected to the second end of the first amplifier; a switch having a first end connected to the first end of the first amplifier, a second end connected to the second end of the first amplifier, and a switch port configured to receive a control signal, the switch being in either an open position or a closed position depending upon a control signal; control logic configured to provide the control signal to open or close the switch based upon a pre-selected condition; and a second amplifier configured to receive a signal at a first end and produce an amplified signal at a second end, the first end of the second amplifier connected to the second end of the first amplifier and the second end of the second amplifier configured to produce an output signal from the variable gain element.

Yet another embodiment describes an analog computer comprising: a plurality of gain elements configured to operate on an overall input signal to provide a solution to a predetermined problem, the gain of each gain element being variable between a level sufficient to propagate a signal input to the element and a level insufficient to propagate the input signal; a gain control means configured to switch the gain of the gain elements between the level sufficient to propagate the input signal and the level insufficient to propagate the input signal based upon a control signal; and a logic means configured to generate control signals causing the gain control means to switch the gain of the gain elements to the level insufficient to propagate the input signal before a change in the overall input signal, and to the level sufficient to propagate the input signal at a time not before the change in the input signal.

DETAILED DESCRIPTION OF THE INVENTION

Figure 1:
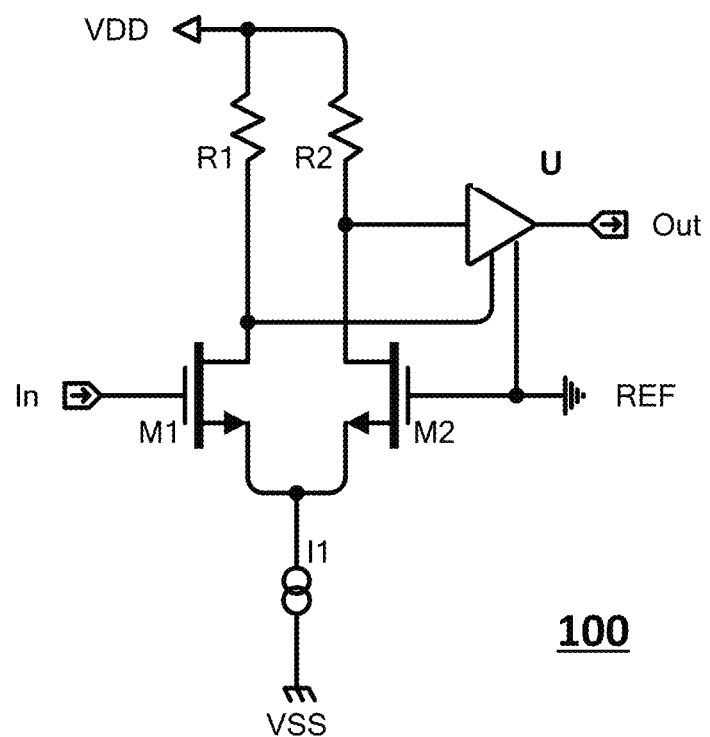
FIG. 1 shows a gain element having variable gain according to one embodiment.

Described herein is an apparatus and method for improving the performance of analog computers. The described apparatus and method utilizes a deliberate reduction in gain of high gain elements present in an analog computer either globally, i.e., across all instances of the high gain element, or in meaningful blocks or subsets of the high gain elements.

Those of skill in the art will appreciate that in an analog computer a conventional solution to the problem to be solved is determined by the simplifying assumption of high gain in the op-amps configured within the analog computer.

As above, there is a transient state of some finite duration between the "old" solution for one input (or set of inputs) and the "new" solution for a new input. However, rather than waiting this finite duration to obtain the new solution and in accordance with the present approach, empirical observations indicate that an analog computer need not execute a transient response from an old input to the new input if the analog computer's gain elements are all reduced to a gain insufficient to propagate the solution within the computer network.

Specifically, the method of the present approach is exemplified by a series of steps:

First, while the old input state is present on the computer, reduce the gain of the computational elements within the analog computer to a level insufficient for the gain elements to propagate a signal. This will cause the solution to the present input to degrade: in the limit as the gain tends to zero, the voltages and currents within the computer will reduce to only thermal agitations. As a result, the signal, which is assumed to still be present at the computer inputs, cannot propagate through the computational elements and will "die away" in elements sufficiently far away (in connectivity terms) from the input.

Next, while the analog computer is in this degraded state of insufficient gain, the input (or set of inputs) is adjusted to a new input value (or set of values). This has little effect on the computer because the effect of the first step above is that the gain is too low to solve the new problem.

Finally, the gain of the computational elements is then restored slightly after or concurrently with the application of the new input, to a gain level sufficient for the gain elements of the analog computer to propagate a signal, and thus to solve the problem now presented by the new input.

The benefit of the procedure is that the time taken to respond to the new input, even in the presence of these three steps, is shorter than that which would result if the gain were not reduced while the inputs were changing. This is contrary to what one of skill in the art would expect. For example, reducing the power supply to a complementary metal-oxide semiconductor (CMOS) logic chip generally decreases speed rather than improving it; for example, a computer processor will slow down in response to a reduction in available power, and therefore performance will be slower, not faster.

This procedure may be viewed as changing the "noise margin" of the system. As is known in the art, to be detectable and useful, a signal must exceed the noise that necessarily accompanies it by a sufficient amount so that the signal may be distinguished from the noise; the noise margin is the ratio by which the signal exceeds a minimum acceptable amount.

In an analog computer, the signal must exceed the noise to a tolerable error rate. Since noise has a Gaussian distribution and is theoretically unlimited in amplitude, the noise margin may be considered as the number of standard deviations of the average noise that a signal must surpass to meet a given error rate. For example, a signal with a magnitude of three standard deviations of the average noise will be exceeded by the noise about 0.3% of the time while a signal of six standard deviations of the average noise will be exceeded by the noise only 0.0000002% of the time.

Using this concept of noise margin, the method described herein may be described as allowing the noise margin of the prior input state to the analog computer to deteriorate to such a degree that the signal is indistinguishable from the noise, i.e., the noise margin is zero. The new input is then applied, and the noise margin caused to increase. All signals then begin to emerge from the noise and converge upon the new solution. The convergence from the noise to the new state is faster than the time that would be needed in prior known systems to transition across the noise margin from the old state to the new state.

The described method thus speeds up an analog computer by defining a non-propagating, noise limited state as an intermediate state between two solutions. Further, in addition to making an analog computer run faster, as one of skill in the art would understand in light of the teachings herein, such a speed up can be translated into reduced power operation of the analog computer.

A somewhat analogous situation that may aid the understanding of the present approach is the problem of placing grocery items on shelves in a supermarket. A store employee has a shopping cart full of items and places them on the shelves in some order, for example alphabetically. After the task is completed, the manager decides that this is not the best arrangement, and asks the employee to reorganize the items on the shelves such that the items are located by food type, rather than alphabetically.

The employee must now take the items down from the shelves and rearrange them. This is time consuming for a number of reasons; the employee must remove each "wrongly" placed item from its location, and then place it in a new location. But that new location may be already occupied by another item that was placed in the prior order. Hence, the employee must move the other item first, and so on.

In this context, the method may be thought of as a "switch," either for all of the shelves or a separate switch for each shelf of group of shelves. When activated, the switch throws all the items back into the shopping cart. Thus, the employee must start over, taking each item out again and this time arranging the items on the shelves by food type. However, since no item is still in its prior place, the employee never has to remove an item from a "wrong" place, and no new placement of an item is blocked by an item from the previous placement, this process is faster.

Before the items in the shopping cart are shelved, they are randomly in the cart; thus, there is no order, and the "noise margin" of the items is zero. Order is applied as the employee shelves the items, so there is now a noise margin. In this example, returning to the disordered state by throwing all of the items off the shelves between the first, alphabetical, shelving operation and the second shelving by food type is faster than having to actually move all of the items directly from the alphabetical order to the food type arrangement.

FIG. 1 shows one type of gain element such as might be used in an analog computer. Circuit 100 will be recognized by one of skill in the art as a type of differential amplifier known as a long-tailed-pair circuit with resistive load, with the addition of a current source I1. Circuit 100 includes two N-type metal oxide semiconductor field effect transistors (MOSFETs) M1 and M2, two resistors R1 and R2 connected between the power supply VDD and the drains of transistors M1 and M2, respectively, an amplifier U and a current source I1.

The amplifier U in this case is a voltage-controlled voltage source with a gain of one, and delivers the voltage difference between the resistor loads R1 and R2 to the output Out and thus to the next circuit. The point REF is a ground which sets a threshold for whether the input signal is a high level signal or a low level signal, and allows the amplifier U to output a signal that is compatible with the next similar gain element.

Figures 2A, 2B:
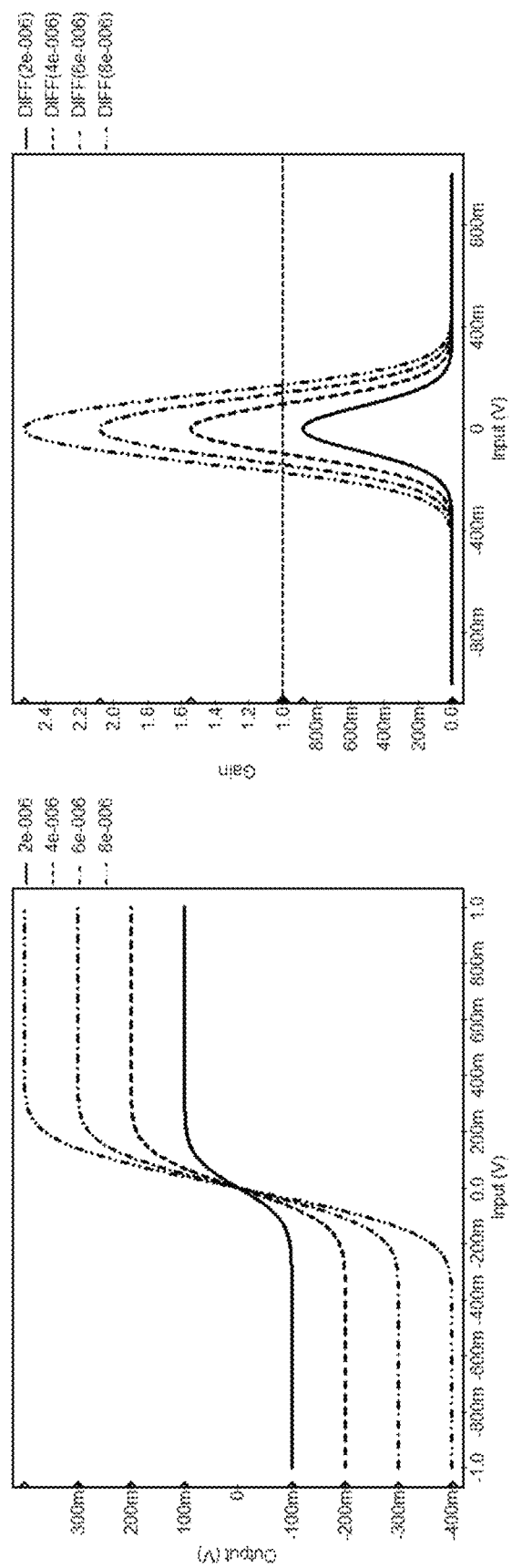
FIGS. 2a and 2b are graphs illustrating the gain characteristics of the gain element of FIG. 1.

However, while the amplifier has a gain of one, circuit 100 can have a gain of more or less than one. In the present approach, current source I1 is capable of providing different levels of current in response to a switch or control circuit as explained further below. FIGS. 2a and 2b show the changing characteristic of circuit 100 as the current through current source I1 is changed from 2 microamps ($\mu$A) to 8 $\mu$A in steps of 2 $\mu$A. Within a certain input range, here ±400 millivolts, at a current of 2 $\mu$A through current source I1, the change of output (y-axis) versus input (x-axis) is less than one, while with a current of 8 $\mu$A the gain is greater than one.

This is because at sufficiently low levels of current through current source I1, the transconductance of transistors M1 and M2 drops and there is no current between the sources and drains of the transistors, and thus no current flows through resistors R1 and R2 and there is no output from circuit 100. Thus, the gain of circuit 100 is reduced by decreasing the current through current source I1.

Thus, one way of increasing the gain of a gain element such as circuit 100 of FIG. 1 from a level insufficient to propagate a signal to a level required to propagate a signal is to add a switch or other element that increases the current through current source I1, and control logic that causes the switch or other element to do so at the appropriate time, i.e., shortly before or simultaneously with a change in the input to circuit 100. Another example of a way to reduce the gain of element is described below with respect to FIG. 10.

If the gain is to be increased after a change in the input signal, a detection and control circuit or logic of some type may be used to determine that a change in input has occurred, and to cause the gain of the gain elements to increase in response. For example, a differential amplifier circuit may be sufficient to detect even small changes in the input and then generate a control signal to increase the gain in the gain elements; after a time sufficient for the analog computer to propagate the input signal and arrive at the output, the gain is again reduced. In some instances, it may be possible to increase the gain of the gain elements to a level sufficient to propagate the input signal simultaneously with the change in input; for example, if the change in input is at regular intervals, a timing circuit may be used to increase the gain based upon a pre-selected condition corresponding to the timing of an expected input signal, i.e., at a pre-selected time or interval that the input signal is expected to change, and then again reduce the gain to a level insufficient to propagate the signal after a known period of time in which the analog computer is able to propagate the signal and arrive at a new output solution. Note that in this case increasing the gain "simultaneously" with a change in input may even encompass increasing the gain slightly before the input signal actually changes if the time by which the increase in gain precedes the change in input is so short that the gain elements cannot respond quickly enough to operate on the prior input signal (if any). Alternatively, as would be understood by one of skill in the art in light of the teachings herein, the issue of the input signal being slightly too early can be solved by the use of logic elements, such as inverters, unity-gain op-amps, or similar devices, that introduce a predictable, short delay.

Figure 3:
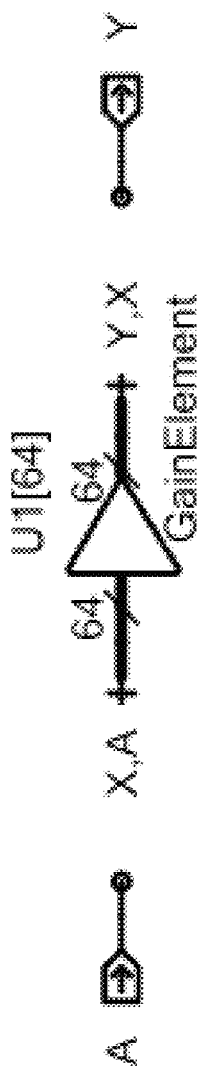
FIG. 3 is a block diagram illustrating a circuit comprising a plurality of gain elements such as that shown in FIG. 1 placed in series.

Consider now what happens when a number of gain elements such as circuit 100 of FIG. 1 are connected in series. FIG. 3 is a block diagram illustrating a circuit 300 that is such an arrangement of gain elements; the gain element is designated as U1, and the number 64 indicates that there are 64 such gain elements connected in series. A first overall input A is applied to the first gain element which outputs an output X; that output x becomes the input A to the next gain element, and so on, until the output of the last gain element is taken as the overall output Y.

With such a series of connected gain elements, it is then possible to compare the time it takes to obtain a solution Y to a problem represented by an overall input A in two different situations. In this example, it is assumed that there is no problem to be solved, but that the output of the circuit is merely to replicate the input, with whatever time delay is inherent in either the conventional approach or the method described herein.

In one situation, i.e., the conventional art, a prior input and solution is being replaced by the new input and solution, and as above a transient state occurs in a conventional analog computer, so that the solution is reached only after the new overall input A propagates through all 64 active gain elements to determine the solution Y. In the second situation, the present approach described herein, the gain of the gain elements has been reduced to zero and is then increased at a specific point in time.

Figure 4:
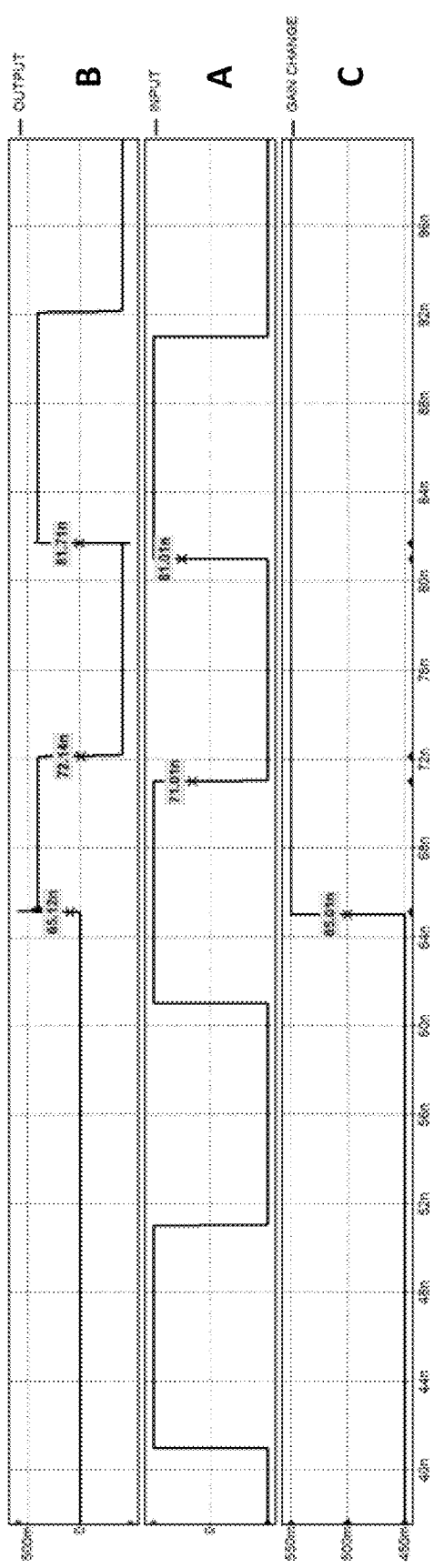
FIG. 4 is a graph of the timing of the output of the circuit of FIG. 3 in response to a new input under both the prior art and an embodiment of the method described herein.

FIG. 4 shows a graph of the results of a Simulated Program with Integrated Circuit Emphasis ("SPICE") simulation of the circuit 300 of FIG. 3 in these two situations.

The input signal, a rectangular clock-type signal, is shown by curve A in FIG. 4, while the output signal is shown by curve B. Curve C in FIG. 4 indicates the change in gain of the gain elements.

The gain of the gain elements in circuit 300 is increased at a time of 65.01 nanoseconds (nS) as shown in curve C of FIG. 4 by increasing the current through the current source I1 from 2 µA to 8 µA. As described above, up until then the gain of the gain elements is low, and thus no signal is propagated from the input, so the output is zero, as seen in curve B.

Once the gain of the gain elements is increased at 65.01 nS, the circuit is able to propagate the input signal. Note that in this case, none of the gain elements have a prior state, as the gain of the gain elements was previously zero. Thus, when the gain is first increased, circuit 300 is operating according to the present approach. As seen in curve B of FIG. 4, the output reflects the input at a time of 65.12 nS; in other words, it takes 0.11 nS, or 110 picoseconds (pS), for circuit 300 to arrive at the output from the unordered state of zero gain.

Now, with the gain high and not subsequently reduced, circuit 300 will continue to operate, but now in a conventional manner, i.e., with a transient state between the output resulting from an input and the next output resulting from a changed input. The first change in input after the increase in gain is the falling edge of the rectangular signal at 71.01 nS; the output changes in response to this change in input at 72.14 nS. Thus, the transient time from the prior output to the new output is 1.13 nS, over 10 times as long as the 0.11 nS change above in which there is no prior output.

As the input signal continues, the next change in input is the rising edge of the rectangular signal at 81.01 nS. Since the gain has remained high, this is again operation of circuit 300 in the conventional manner of the prior art. The output changes in response to the rising edge of the input signal at 81.71 nS, thus resulting in a transient time of 0.7 nS. While this is shorter than the transient time in the case of the falling edge (such asymmetry resulting from different rise and fall times is not uncommon), it is still over six times as long as the situation in which there is no prior state.

There is a further benefit to the described method in addition to the faster processing time; when operated with no gain, circuit 300 uses significantly less power than when it is operated in the conventional manner.

In conventional operation, all 64 gain elements of circuit 300 will require a continuous current through I1 of 8 µA, for a total current of 512 µA. By contrast, when operated in the way described herein, each gain element requires only 2 µA, or 128 µA, except for the period in which circuit 300 must respond to a change in input, i.e., around 110 pS for each change in input (allowing again for different rise and fall times). It will thus be seen that if the gain of the gain elements is increased when a change of input is applied, and then decreased after a new output is obtained, the total current consumed will only be slightly more than one-quarter of the current consumed in conventional operation.

Figure 5:
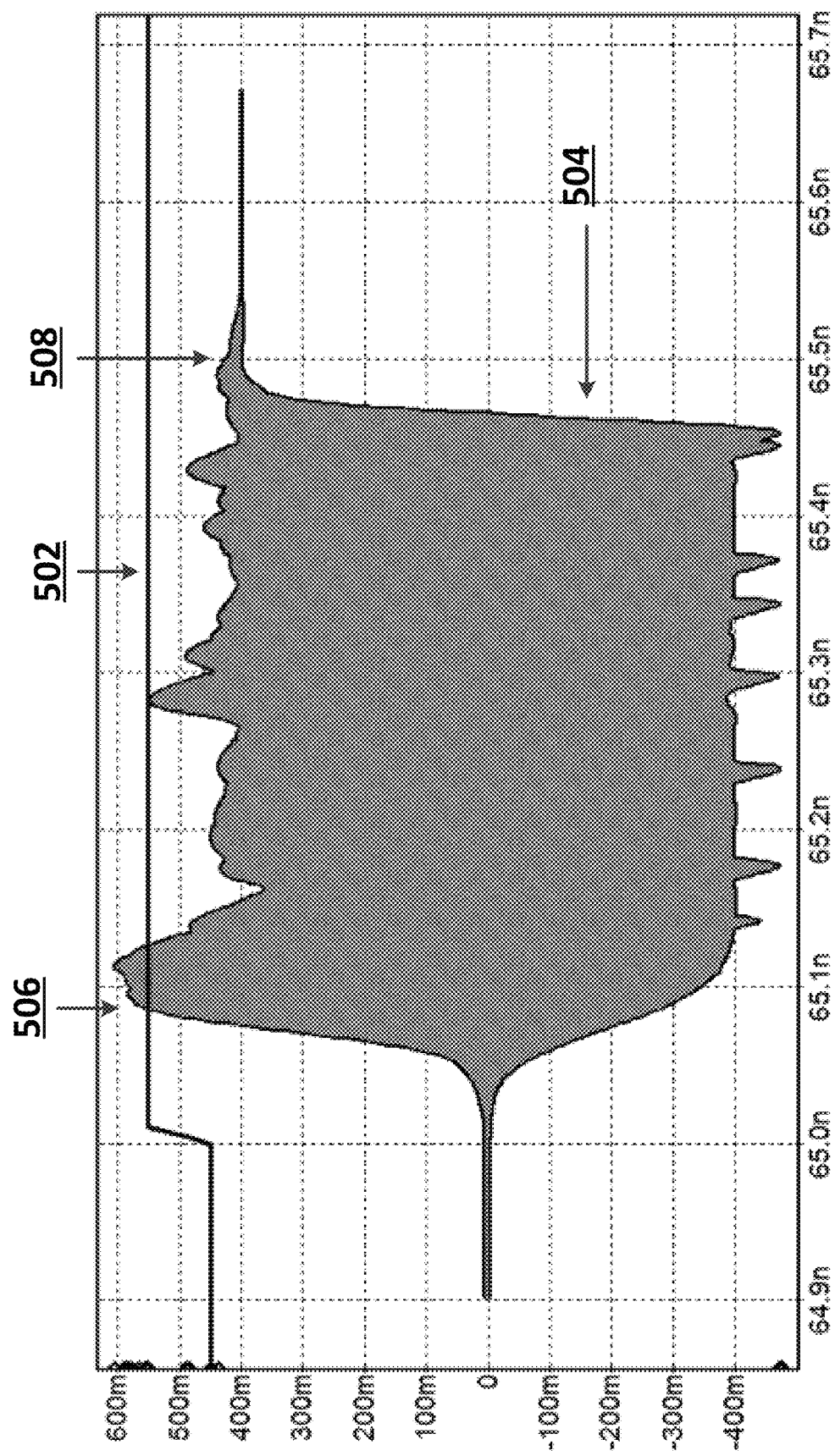
FIG. 5 is a graph of a plurality of randomized simulations of operation of the circuit of FIG. 3 in one embodiment.

FIG. 5 is a graph of 16 randomized simulations of operation of circuit 300 of FIG. 3 using the present approach described herein. As seen by line 502, an input is provided at the same time that gain is increased, at 65 nS in this example. Shaded area 504 in FIG. 5 is an outline of all of the responses in the 16 simulations. In the best case, circuit 300 arrives at an output before a time of 65.1 nS, i.e., in less than 100 pS as seen at point 506, while in the worst case, the output comes to a valid level by a time of 65.5 nS, i.e., in less than 500 pS as seen at point 508, even given random variation in the construction of the gain elements. This is still less than half of the 1.13 ns time found in idealized simulations of the circuit operated in the conventional manner as discussed with respect to FIG. 4 above, thus demonstrating the benefit of the present approach even in the presence of random manufacturing errors.

One area where the present approach can have benefit is in the design of analog artificial intelligence (AI) processing units. An analog AI computer can be constructed with a number of circuits like circuit 100 of FIG. 1 using a known in the art T-model implementation of an AI network.

As is known, an AI neural network has "layers." The higher the layer count, the more benefit the present approach can provide, because as the number of layers the input signal must propagate through increases, the benefit of the present approach also increases.

Figure 6:
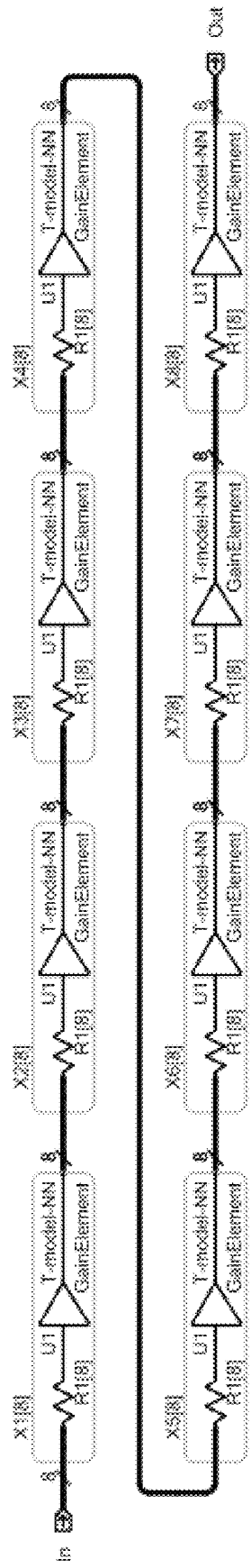
FIG. 6 is a block diagram illustrating an example of an analog neural network as is known in the art.

FIG. 6 is a block diagram illustrating an analog neural network 600 as is known in the art. As illustrated, neural network 600 has eight layers, each comprising an element Xn, and thus produces eight outputs. Each element Xn has 8 neurons in a vertical column, and each neuron has 8 resistors so that each element Xn has 64 weights; since there are 8 elements Xn horizontally, there are a total of 64 neurons, and 512 weights.

Figure 7:
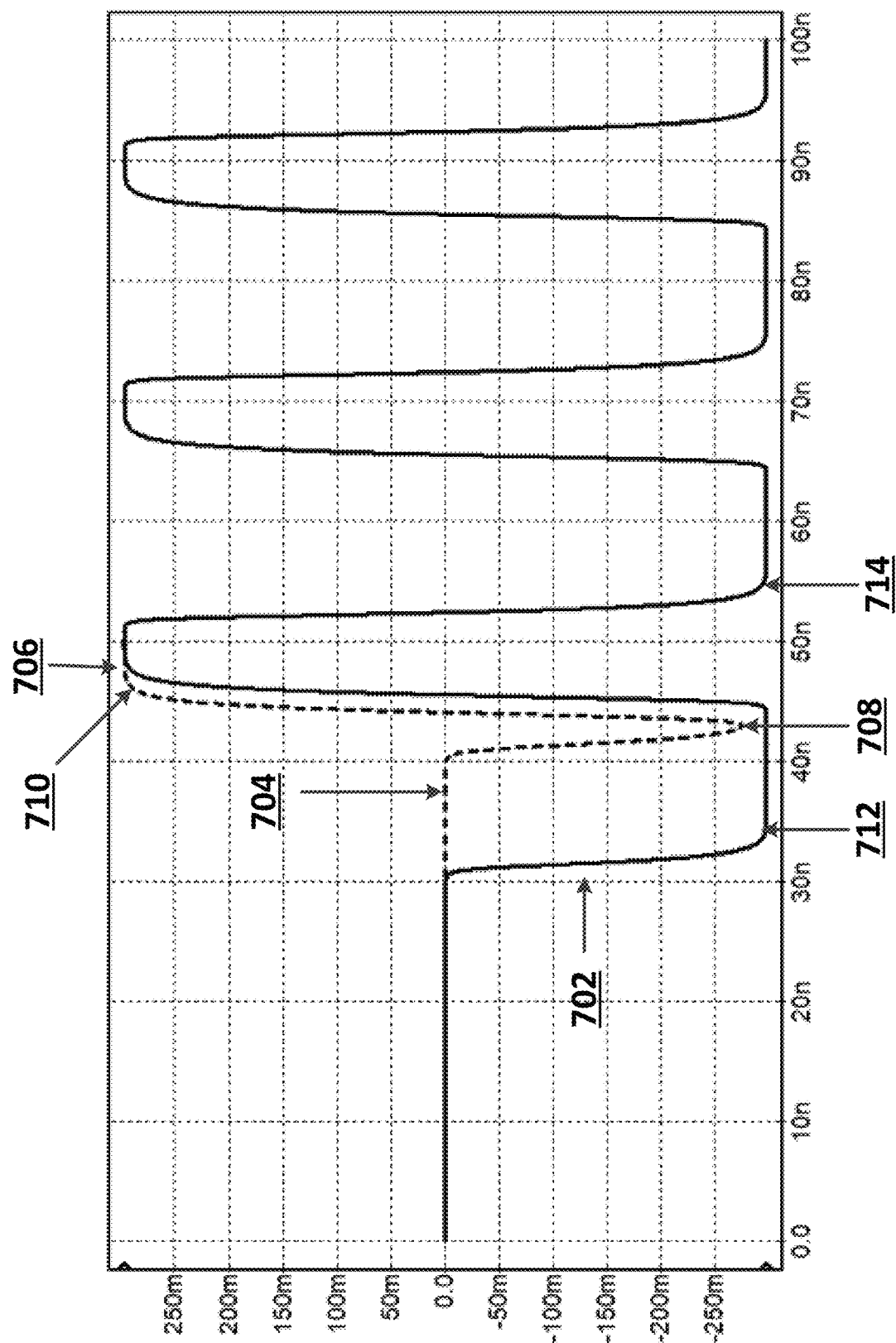
FIGS. 7 to 9 are graphs of an example of one of the outputs of the analog neural network of FIG. 6.
Figure 8:
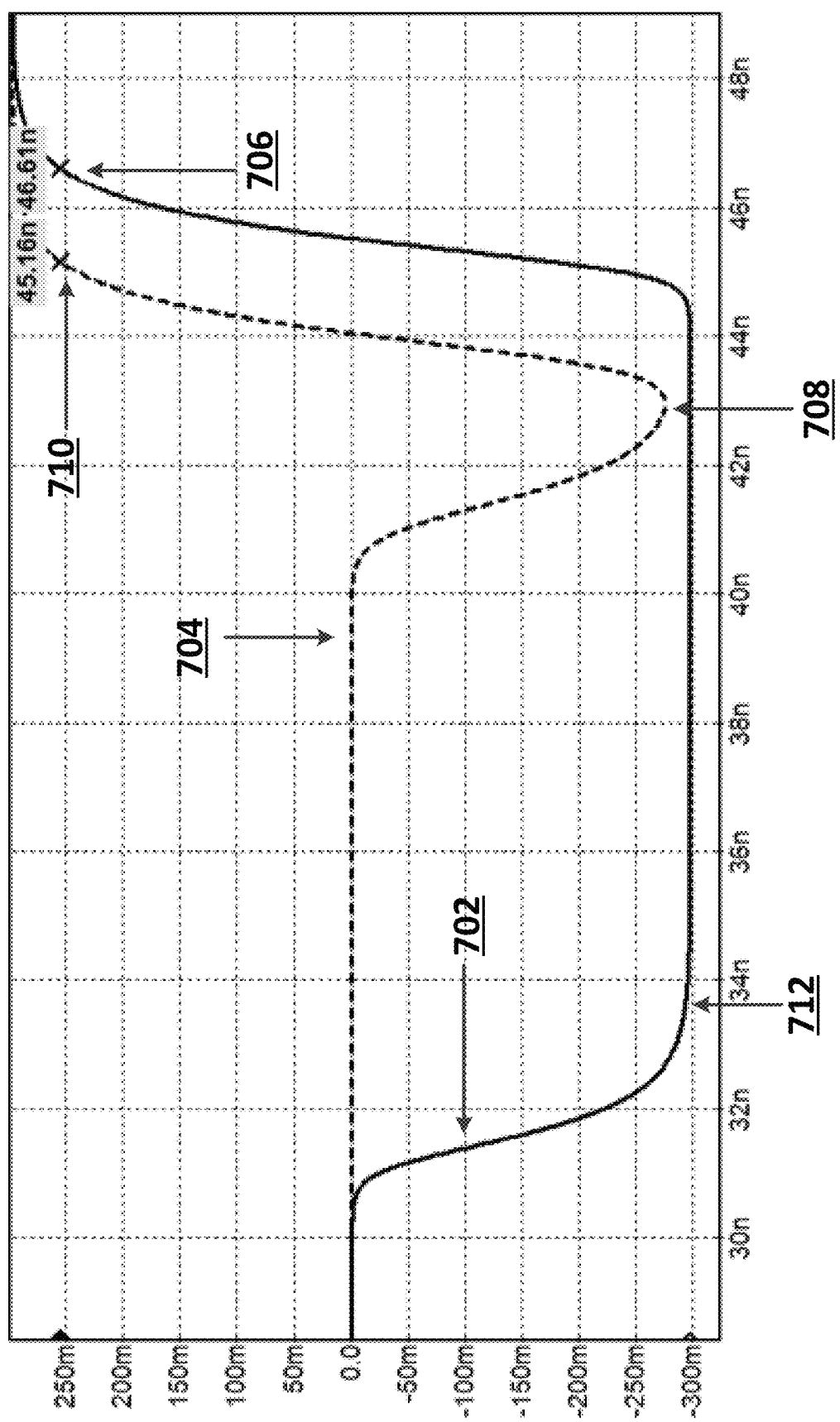
Figure 9:
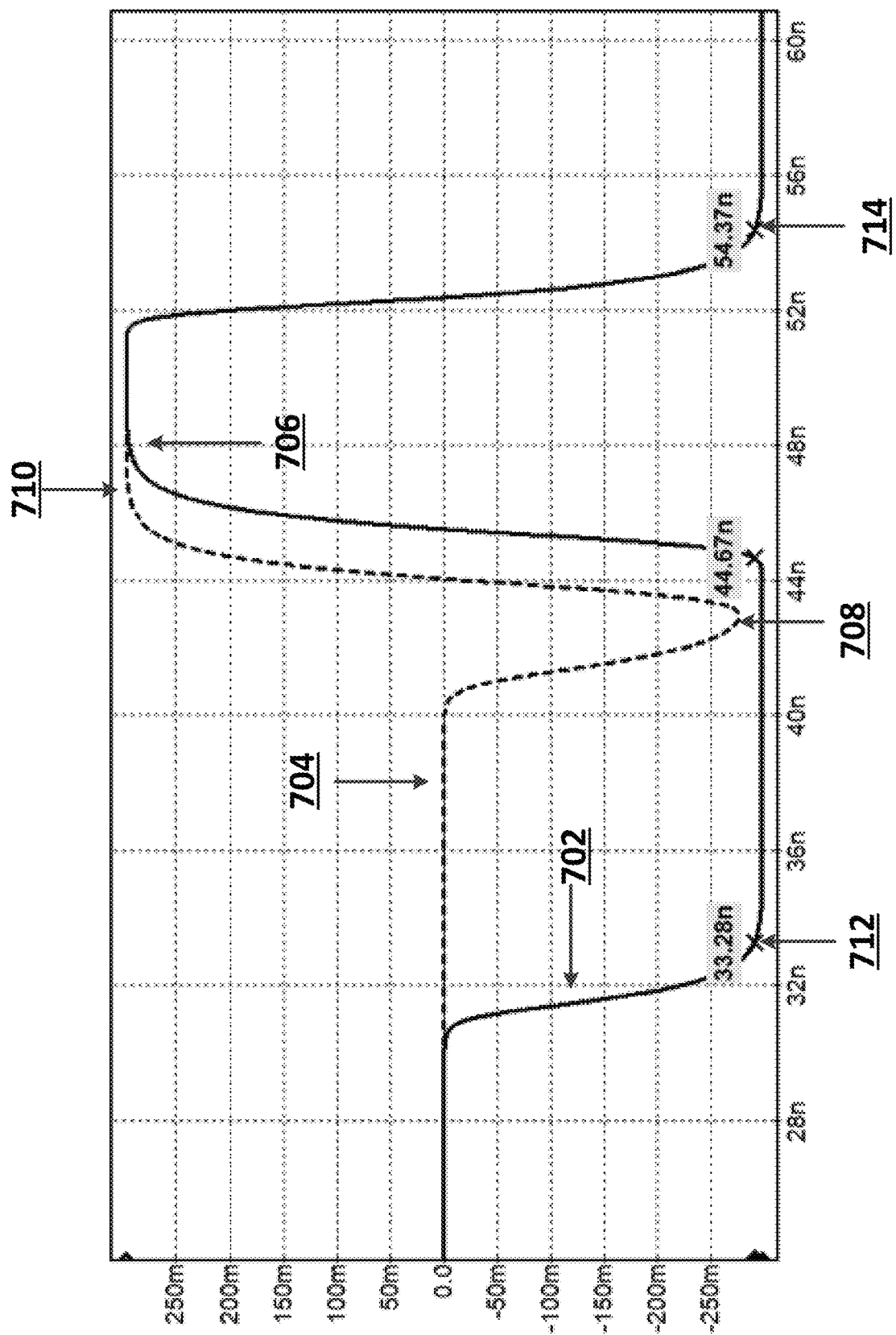

FIGS. 7 to 9 show a comparison of one of the eight outputs of AI neural network 600 of FIG. 6, again in two different situations, one being the conventional manner of the prior art and the other being that of the method of the present approach described herein. In FIGS. 7 to 9, two input patterns are applied which alternate every 10 nS. In the curves 702, the gain of the gain elements of AI neural network 600 is increased simultaneously with one change in the input pattern at a time of 30 nS; in the curves 704, the gain is increased simultaneously with another change in the input pattern at 40 nS.

When the input pattern changes from low to high at 40 nS, AI neural network 600 is in conventional operation, as the gain has been high since 30 nS, and there is thus a prior output state and transient time as described above. Solid line 702 shows that the output switches from its low level, about −300 mV, to its high level, +300 mV, and as seen in more detail in FIG. 8 reaches the high level at 46.61 nS at point 706.

When the gain is increased at 40 nS, at the same time the input changes from low to high, AI neural network 600 is operating using the method of the present approach and there is no prior state (the prior output is zero). Dashed line 704 shows that, while the output starts in the wrong direction, going negative at first, at portion 708, the output still reaches its high level faster, at 45.16 nS (FIG. 8) at point 710. Thus, using the method of the present approach, the high level output is reached after 5.16 nS at point 710 rather than 6.61 nS at point 706 as in conventional operation, i.e., about 30% faster than the conventional operation.

FIGS. 7 to 9 further illustrate that the present approach also results in reaching the output in less time even when the input pattern switches in the other direction, i.e., allowing for asymmetry of rise and fall times. When the gain is increased at 30 nS along with a change in input pattern, again AI neural network 600 is operating by the method of the present approach, as there is again no prior state (the prior output is zero). Here the output reaches its low level in 3.28 nS at 33.28 nS, at point 712.

When the input pattern changes at 50 nS, however, AI neural network 600 is operating in the conventional manner since the gain of the gain elements has not been reduced. The output returns to its low level at 54.37 nS, i.e., after 4.37 nS, at point 714. Thus, switching the input pattern from a high level to a low level results in the low level output being reached after 3.28 nS with the method of the present approach rather than 4.37 nS with conventional operation, again about 30% faster.

Figure 10:
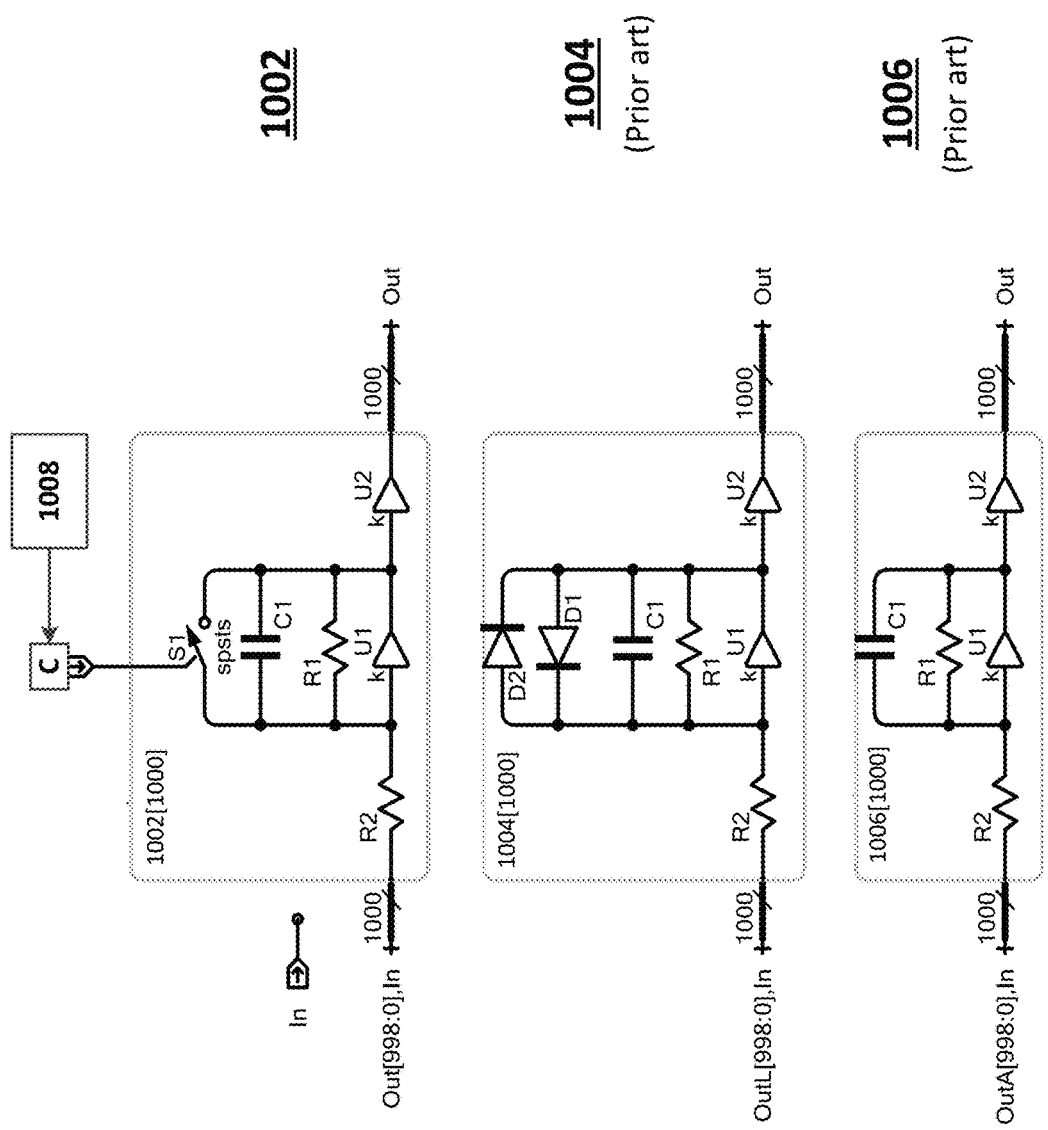
FIG. 10 shows a block diagram of one embodiment and block diagrams of prior art circuits that provide similar functionality.

FIG. 10 shows block diagrams of one embodiment of the present approach compared to prior art circuits that provide somewhat similar functionality but without using the method of the present approach. Simulations using the circuits of FIG. 10 provide further evidence of the speed improvement obtained by using the described method rather than the prior art.

Each circuit 1002, 1004 and 1006 in FIG. 10 contains first and second amplifiers U1 and U2, feedback components R1 and R2, and a capacitor C1. Amplifier U1 has a gain of, for example, −10,000, and one of skill in the art will appreciate that it is thus operating as a high gain stage with a signal gain defined by the feedback components R1 and R2, i.e., a gain of −R1/R2, while second amplifier U2 is operating as a signal inverter so that the output of circuit 1002 is not inverted and the overall gain of circuit 1002 is R1/R2. Capacitor C1 defines a finite bandwidth for the gain of each circuit so that the delay for each circuit may be accurately compared, and is not otherwise necessary for the functioning of circuits 1002, 1004 and 1006.

In this example, each circuit 1002, 1004 and 1006 is connected in a chain of 1000 such circuits, as indicated by the bracketed notations of 1002[1000], 1004[1000] and 1006[1000]. Conversely, the wires to the left of R2 and to the right of U2 as they emerge from the repeated instance of each circuit are of bus width 1000, and thus differ in each repeated instance of the circuit.

The thousand elements on the bus to the left of R2 are made up of firstly, in the least-significant bit (LSB) position, the input wire In, followed by the elements 998 to 0 of the output bus Out from the previous circuit. This nomenclature results in a series connection of the 1000 instances of X1, since In enters the $0^{th}$ element into R2 and the signal emerges on the $0^{th}$ element of the bus Out. This $0^{th}$ element of the bus then connects to the next-to-LSB, namely the first instance of the repeated circuit, whose output in turn is the first element of the output Out of the first instance of the circuit, which connects to the second instance of the circuit, and so forth. The desired result of all one thousand of X1 being connected in series is achieved by this notation and use of busses.

When it is assumed, as in this description, that each of iterated instances may differ, the use of buses and iterated instances in this fashion allows for a reasonable representation of a complex circuit. It is this difference in the iterated instances that allows variations in the circuit and implementation of networks similar to those expressed in code in the methodology common to the art of AI development.

Circuit 1002 of FIG. 10 is an embodiment using the method of the present approach. As above, the method of the present approach has a means to reduce the gain of the gain elements; in circuit 1002 such a means is shown as a switch S1 with a controlling port receiving a control signal C, which is driven by control logic 1008 that determines the state of control signal C.

If the control signal C is active the switch S1 is closed, thus reducing the gain considerably since closing switch S1 shorts out resistor R1, reducing R1/R2 to nearly zero. Note that the control signal C is common to, and received by, all 1000 instances of circuit 1002, as indicated by the fact that the wire from C to the repeated element 1002 is not a bus but is of width 1. If R1 is equal to R2, circuit 1002 has a nominal gain of 1.

Circuit 1006 of FIG. 10 is an example of a linear amplifier used in an analog computation without the benefit of the present approach, since it contains no means to reduce its gain. As with circuit 1002, if R1 is equal to R2, circuit 1006 has a nominal gain of 1.

Circuit 1004 is a logic gate model as is known in the art. In circuit 1004, the value of R1 is considerably higher than the value of R1 in circuits 1002 or 1006. Thus, the gain from the R2 input to the U2 output of circuit 1004 is higher than in circuits 1002 or 1006. However, this gain is limited by the back-to-back diodes D1 and D2. The result is that circuit 1004 operates in a mode similar to a logic gate, i.e., a high gain region exists near the nominal zero input point, but the output is limited to a restricted range by some means, commonly the power supply rails in the case of CMOS.

By separately connecting 1000 instances in series of each of circuits 1002, 1004 and 1006, a test bench can be created to simultaneously compare three different methodologies for signal processing.

In this example all of the resistors R1 and R2 are set to a value of 10 kilohms except for resistor R1 in circuit 1004, which is set to 100 kilohms. Consequently, the gain from the input of R2 to the output U2 of circuit 1004 is nominally 10, rather than one as in the cases of circuits 1002 and 1006.

Figure 11:
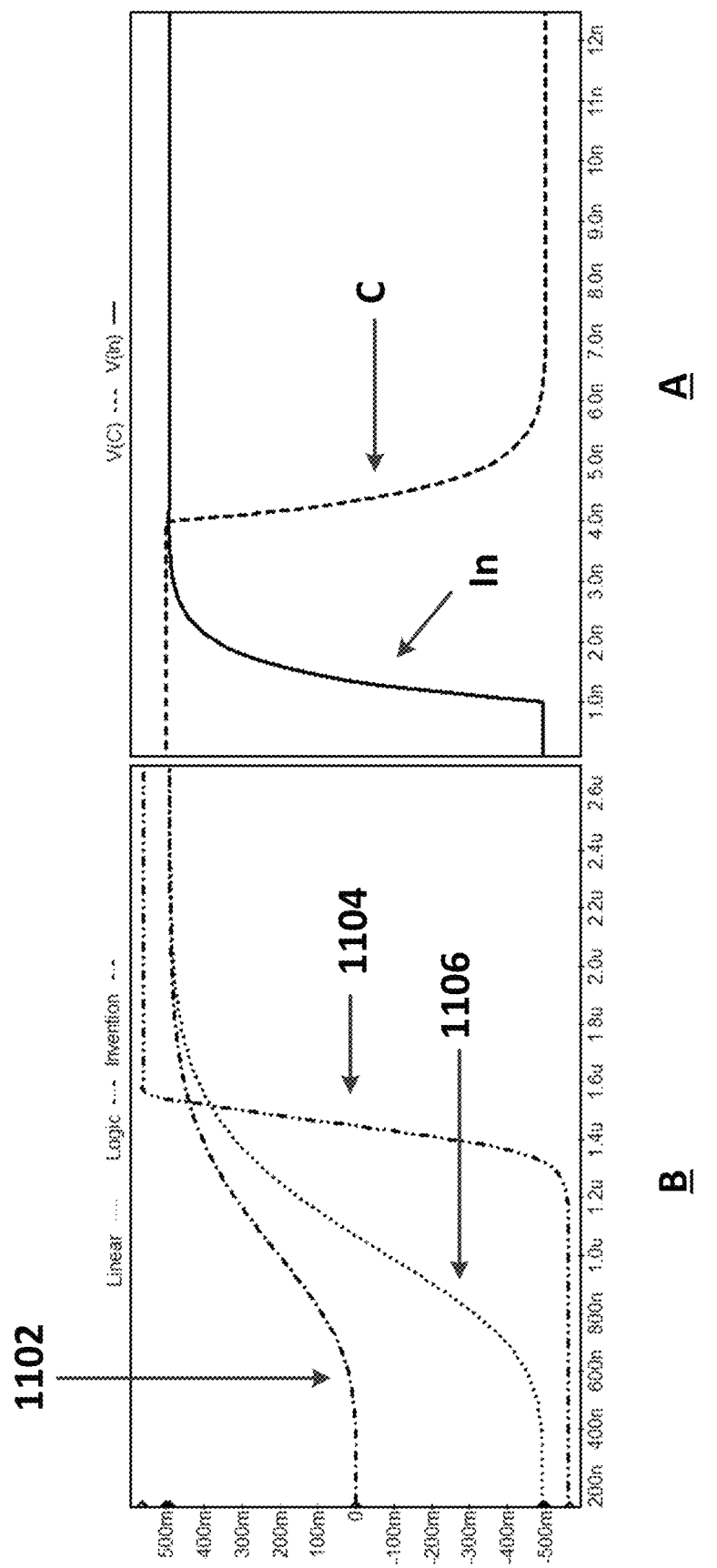
FIGS. 11 and 12 are graphs of the comparative speed of the circuits of FIG. 10.
Figure 12:
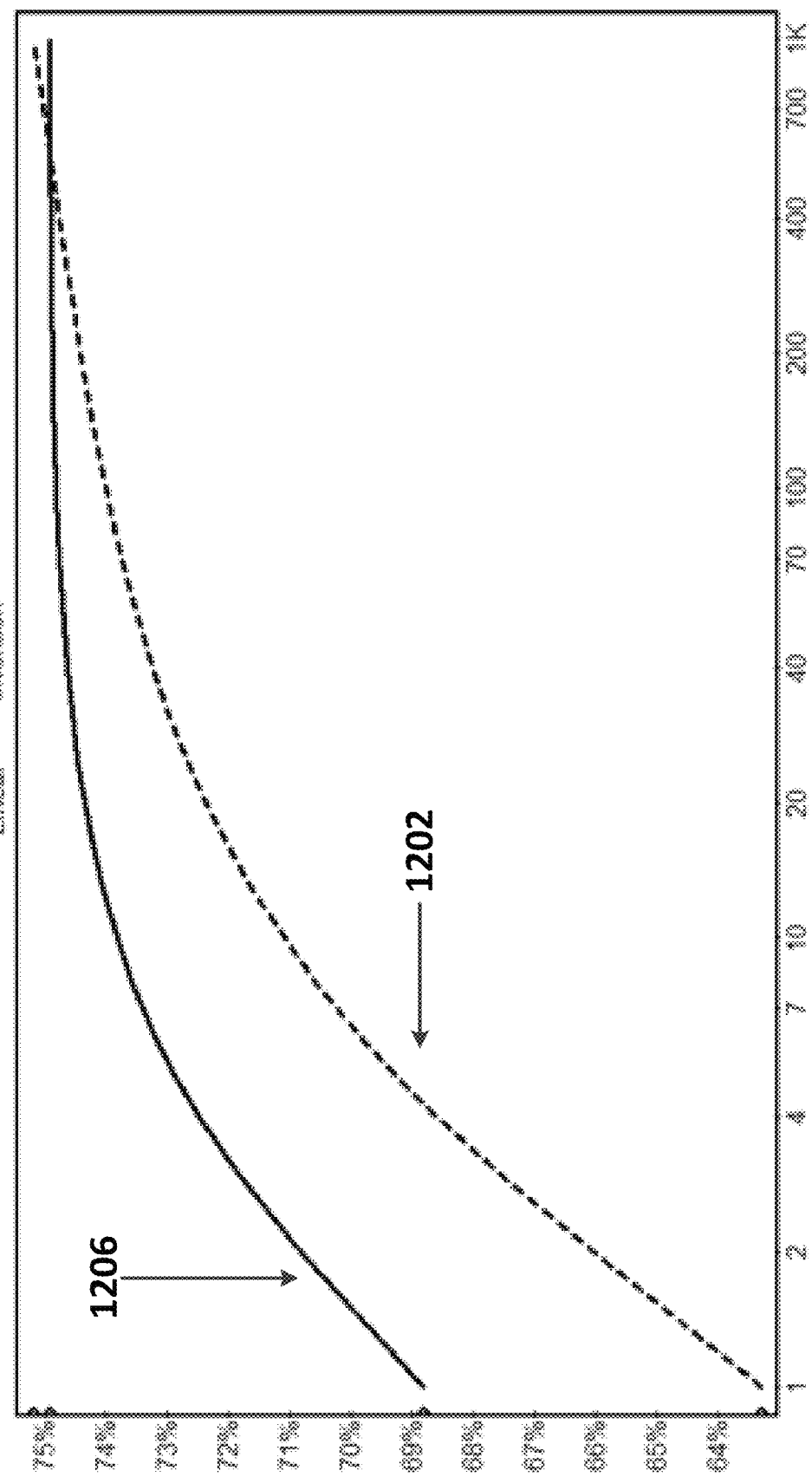

FIGS. 11 and 12 are graphs of the comparative speed of the circuits of FIG. 10. As a test, the input signal In to each series of circuits 1002, 1004 and 1006 is initially set at −0.5 V and at a time of 1 nS switches to +0.5 V. The signal C, which is used as a control in circuits 1002, is initially set at 1V, holding switch S1 closed and keeping circuits 1002 in a low gain, non-propagating state. At a time of 4 nS, i.e., 3 nS after the input has changed, the signal C changes to 0 V, opening switch S1 and increasing the gain in circuits 1002, thus allowing the signal to propagate. The In and C signals are shown in graph A of FIG. 11.

Graph B of FIG. 11 shows the response of the various circuits. As shown by curve 1104, the series of digital logic circuits 1004 of FIG. 10 has switched at about 1.4 microseconds (μS). Curve 1106 shows that the linear circuit 1006 of FIG. 10, not using the present approach, has switched at about 1 μS. Thus, a chain of linear amplifiers, each with the same gain bandwidth product as a logic gate, even without benefit of the method of the present approach, will respond faster than the series of logic gates. Note that in both of these circuits the output must change from a low value due to the existence of a prior state.

Circuit 1002 of FIG. 10, using the present approach, shows the fastest response. Prior to the change in gain at time 0 on the X-axis, circuits 1004 and 1006 are in the prior state, as seen in curves 1104 and 1106, respectively. Circuit 1002, however, is in the zero state, as will be the next gate in the chain, although at this point there is no noise margin and there are only thermal changes. Once the input signal and gain change, all three circuits begin to respond. If an output signal of 100 mV is an acceptable margin, as seen in curve 1102 of FIG. 11, the output of the series of circuits 1002 has emerged from the zero state to that level beginning at about 800 nS, again significantly faster than the other circuits 1004 or 1006, which reach that level of output at about 1.4 μS and 1.1 μS respectively, and approaches its final value faster than circuits 1004 or 1006.

Another comparison between a series of linear amplifier circuits 1002, benefiting from the present approach, and 1006, without such benefit, is seen in FIG. 12. Here it is assumed that the output cannot be presumed valid until it is halfway to its value, or about 220 mV as seen in FIG. 11.

FIG. 12 is a plot of the percentage of digital delay versus the position in the chain of elements in the series of circuits 1002 and 1006. Curve 1202 shows the results for a series of linear amplifier circuits 1002 of FIG. 10, which use the present approach. Curve 1206 shows the results for a series of linear amplifier circuits 1006 without the benefit of the present approach.

The X-axis of FIG. 12 is logarithmic and indicates where in the series of circuits the delay comparison was done. The Y-axis is the percentage improvement of speed of the series of circuits over the digital circuits 1004 of FIG. 10.

As seen in curve 1206, the series of circuits 1006 asymptotically approaches a 25% reduction in delay compared to a series of logic gates as the number of connected elements increases. The series of circuits 1002, using the present approach, show a greater improvement in speed up until about 500 circuits are connected in series. In what might be a typical case in which as many as 20 layers are used in a neural network, the present approach results in about a 28% improvement in speed.

Note that these results also greatly understate the benefit of analog computers over digital computers in certain applications, as complex calculations may be done in an analog computer in only a few equivalent gate delays. For example, an analog computer configured to find the Fourier transform of a signal over 128 bins requires 8 layers of analog processing units. As seen in FIG. 12, these 8 units will run in about 70% of the time of 8 logic gates in series.

However, very little can be done in a digital processor in 8 logic gate delays; a Fourier transform may take thousands of gate delay equivalents in a digital computer. Thus, in certain types of applications, analog computation may be thousands of times faster than the digital equivalent, and are made even faster by using the present approach.

Figure 13:
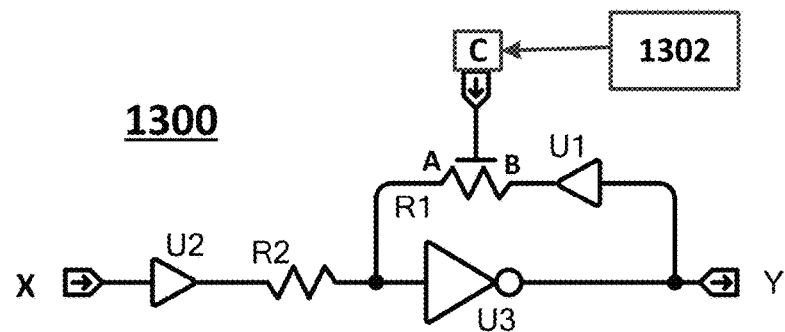
FIG. 13 is a diagram of an inverter circuit that illustrates certain aspects of the method described herein.

FIG. 13 is a diagram of a circuit 1300 that illustrates certain aspects of the present approach, i.e. a control mechanism and the increase in speed that can be achieved when the noise margin is reduced.

Element U3 in circuit 1300 is a conventional inverter as known in the art. R1 and R2 are ideal resistors, with R1 having a resistance that is adjustable in response to a voltage applied at port C that function as a control signal. Control logic 1302, which as above may be a detection of timing circuit, determines what voltage is applied at port C. For purposes of demonstration, R1 may be a macro model, i.e., a code model of an electrical device. An example of a code model describing R1 is:

$$AR1ABi = V(A,B)/(10k + V(C)*40k) \quad \text{(Equation 1)}$$

This indicates that adjustable resistor 1 has a current flow between the ends A and B of R1 that varies based upon the voltage V(C) applied at port C, corresponding to a resistance of 10 kilohms when V(C) is 0 volts, 50 kilohms when V(C) is 1 volt, 540 kilohms when V(C) is 10 volts, etc. (The choice of the 40 kilohm value in Equation 1 is arbitrary.) Thus, R1 is adjustable between 10 and 50 kilohms when a control signal of up to 1 volt is available. An appropriate value for R2 in this case is 10 kilohms.

Circuit 1300 also includes buffers U1 and U2 that do not alter the voltage applied to them but rather act to reduce the voltage gain of inverter U3. Buffer U1 presents current flowing through R1 from creating a load on the output of inverter U3, and buffer U2 prevents any element driving the input port from being loaded by resistor R2. The input node of inverter U3 is assumed to be of high impedance and thus unaffected by the presence of resistors R1 and R2 on the input node.

As is known in the art, the gain of circuit 1300 is limited by the feedback loop, and has a top gain of R1/R2. Thus, in the limit as V(C) tends to infinity, circuit 1300 looks like a conventional inverter of the prior art. The input signal to inverter U3 arrives through input port X, buffer U2 and resistor R2. The output signal emerges on port Y and, since V(C) is assumed to be a high voltage, R1 is of high impedance and has no effect upon the input signal arriving via R2. Further, the presence of R1 has no effect on the inverter U3 output since the buffer U1 removes that resistor load.

Even a relatively high voltage V(C) will not significantly limit the gain of the inverter. For example, if V(C) is 10 volts, the value of R1 is 540 kilohms. Since the value of R2 is 10 kilohms, the gain of inverter U3 is again limited to R1/R2, or 54, by resistors R1 and R2; however, this is typically higher than the inherent gain, or "self gain," of inverter U3. Thus, signals pass from input port X to output port Y unaffected, without any effect from the variable gain aspect of the present approach.

However, as the control signal voltage V(C) is reduced the inverter gain begins to be limited. As above, when V(C) is one volt the value of R1 is effectively 50 kilohms and thus R1/R2=5 and the inverter gain is limited to 5. The circuit 1300 of FIG. 13 can thus function as a "test bench" where varying values of V(C), and thus various different gains, can be applied to inverter U3.

Figure 14:
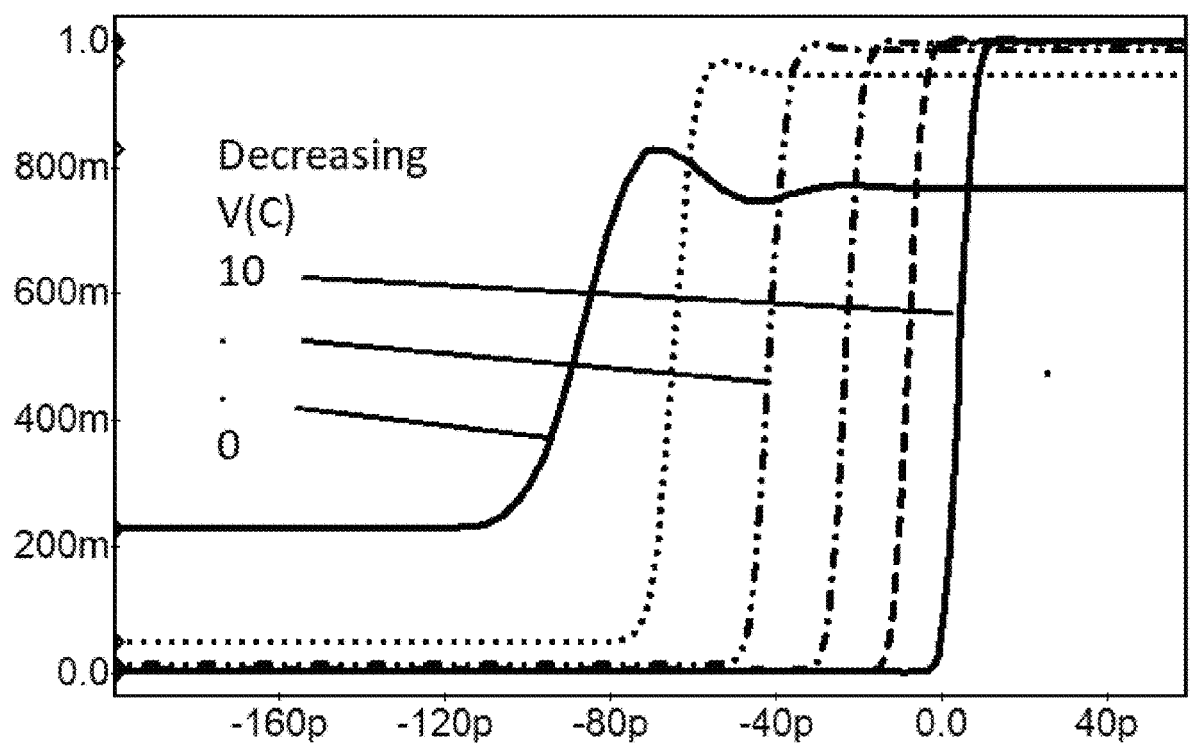
FIG. 14 shows graphs of the result of sending a logic signal through a series of instances of the inverter circuit of FIG. 13 at different values of a control signal.

FIG. 14 shows graphs of the result of sending a logic signal that changes from a low level (zero) to a high level (one) through a series of 32 instances of circuit 1300 of FIG. 13 at different values of the control signal V(C). The right-most curve 10 of FIG. 14 is for V(C)=10 v and corresponds to the known art of the inverter gain being essentially unlimited, where there is no benefit of the present approach. The Y-axis shows the output of the series of circuits.

The X-axis of FIG. 14 shows the time the series of circuits takes to change the output from low to high, and is labeled to show the delay of the series of circuits 1300 operating as in the prior art as being nominally zero. As can be seen in the other curves of FIG. 14, as the voltage V(C) is reduced, the input signal is able to propagate faster though the series of circuits.

This demonstrates one aspect of the present approach: the delay of a chain of events, whether a logic delay as in this example, or an analog signal passing through a chain of amplifiers, is impacted by the gain that each element has. This is contrary to what one of skill in the art will likely think, which is that the delay increases with a decrease in gain, rather than the decrease in delay seen here.

One possible conclusion from this effect is that if a certain signal to noise ratio is required, signal amplitudes must exceed the noise in the circuit by a calculable amount. As the gain of each element is reduced, signal amplitude is reduced: this can be seen in FIG. 14, where the highest and lowest levels of the waveforms change as the gain is reduced. In other words, the noise margin, the degree to which a signal exceeds the noise, is reduced. In certain configurations, which are the subject of the present approach, it is the decreasing noise margin that allows for a higher speed.

It may be argued that the results of FIG. 14, while interesting and demonstrating the trade-off between noise margin and speed, indicate that the present approach is not practical. First, the gain reduction in the prior art inverter has been achieved with feedback to limit its output swing. This is known to significantly increase the gate power consumption (because the output of a CMOS logic gate, if held at a voltage between the power rails, results in a DC current flow through the N-type metal-oxide-semiconductor ("NMOS") and P-type metal-oxide-semiconductor ("PMOS") devices).

Second, the decreased noise margin, i.e., a reduction in the signal to noise ratio, would be deemed unacceptable from Bit Error Rate (BER) requirements. For example, if an error of one bit per billion bits is required, the signal to noise level in the logic (or analog) circuit must be high, meaning that the noise margin must be relatively large. The noise margin required to meet the desirable very low BER does not result in a reduced delay. Nonetheless, FIG. 14 demonstrates that the present approach can speed up the performance of a circuit by using a control signal, V(C) in this example, that dynamically controls the circuit gain.

However, it is not necessary that the noise margin remain at the final noise margin for the entire time of operation. At the start of an interval of computation (i.e., when the circuit first begins to calculate a new result) the noise margin may be low, and the delay then being short as above. As the computation interval unfolds, the noise margin rises, so that at the end of the computation interval the noise margin is sufficiently large to support the required BER.

Certain internal calculations that are necessary to compute the final output (for example, changes in electrical parameters such as voltages on logic gates, outputs of op-amps or similar items in analog computers) evolve in the first fraction of the computation interval when the noise margin is low, and so benefit from the reduced delay. The overall time to reach a desired bit error rate is reduced due to the fact that some of those computations occur during the low noise margin, higher speed environment of the first part of the computation interval. This is a further benefit of the present approach.

Again, some of skill in the art will recognize that many means of reducing noise margin, such as reducing the power supply voltage to a CMOS logic circuit or op-amp, do not result in an increase in speed. However, as above, the present approach is a case in which reduced noise margin does result in increased speed, as in FIG. 14. Of course, there are still some issues to be considered with respect to circuit 1300 of FIG. 13.

The first issue, as above, is that a certain noise margin is required to meet a given BER; also as above, the noise margin is variable within the computation interval and reaches the required noise margin by the end of that interval. The second issue is that circuit 1300 of FIG. 13 consumes significantly more power when in the low noise margin, high speed state. Thus, the speed-power product of circuit 1300 FIG. 13 could be inferior to a circuit not benefiting from the present approach.

There are many techniques in the known art that can be used to speed up a computer; for example, the gate sizes may be changed to provide more current during the transition, either by advancing the process to sub-10 nm dimensions, or by paralleling (increasing the width) of the CMOS devices. These are all known to result in a certain speed-power product: at this point in the technology roadmap the speed-power product has a particular value. The present approach, if it were to decrease the noise margin and increase speed at the expense of consuming more power, might be a less useful innovation. However, the present approach can also improve the speed-power product.

The embodiment of the present approach as will now be described mitigates these issues of circuit 1300 of FIG. 13. Specifically, this embodiment utilizes the observation that a calculating device, whether a chain of asynchronous logic gates (for example, the well-known set of a few gates that form a seven-segment decoder, or the very many gates that form a digital multiplier) or a set of interconnected analog computing elements (for example, op-amps configured to solve a differential equation) have a finite time of operation and an ultimate result whose accuracy (i.e., freedom from significant BER) depends upon the noise margin as described above.

Note that in each example of the present approach there is at least one control signal corresponding to the signal V(C) on node C of circuit 1300 in FIG. 13. That control signal will be causing the noise margin to change over the computation interval of a system benefiting from the present approach.

Figure 15:
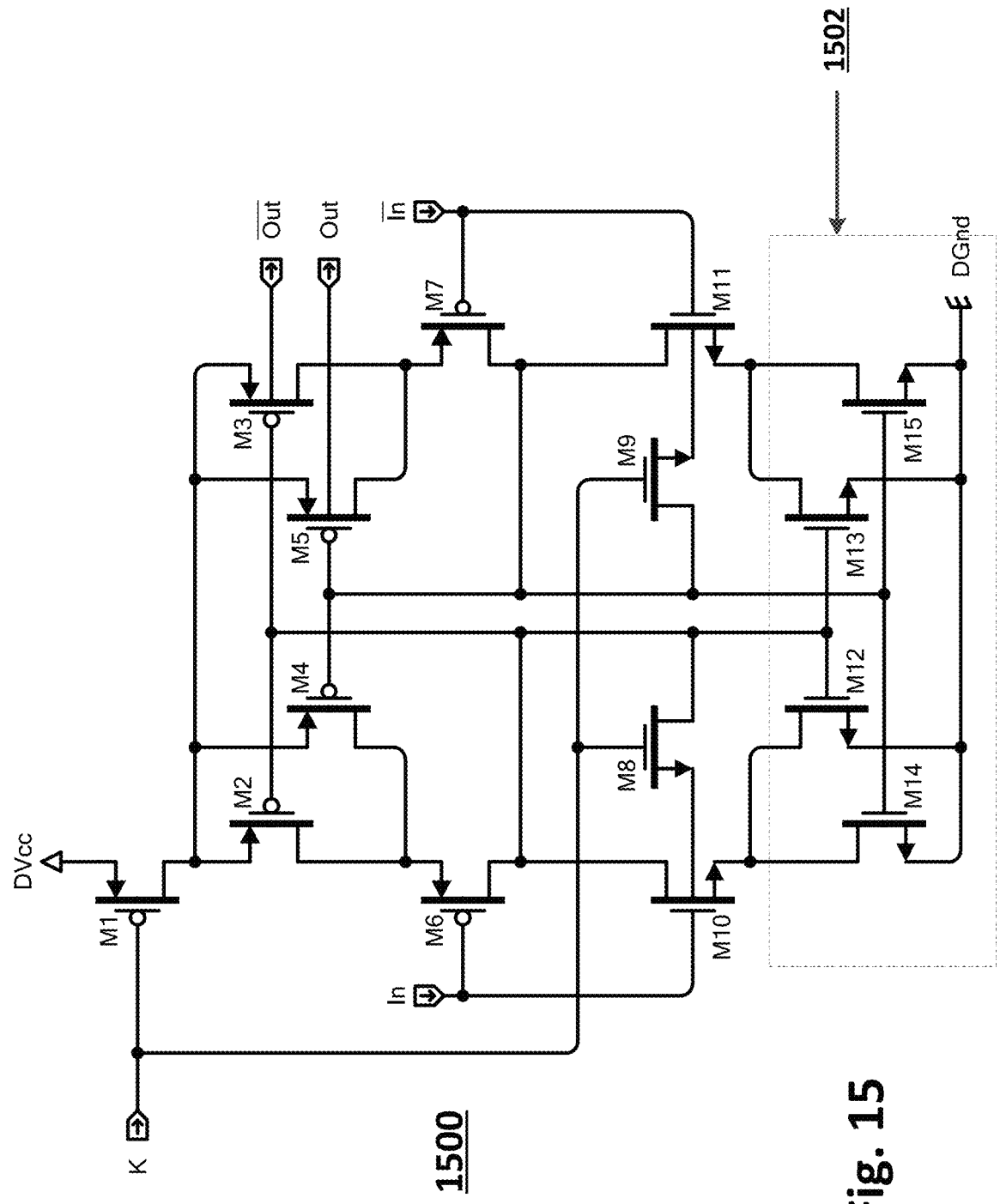
FIG. 15 is a circuit diagram of one embodiment of a differential circuit according to one embodiment.

FIG. 15 is a circuit diagram of one embodiment of a differential circuit 1500 using the present approach that may be used in an analog computer.

Similarly to the differential circuit 100 of FIG. 1, in circuit 1500 a differential amplifier is formed by transistors M6 and M11, which receive the non-inverted input signal In, and transistors M7 and M11, which receive the inverted input signal "Inb" or "In-bar" (shown on FIG. 15 as In with a line above to indicate the inversion, as is common in the art). The inverted output signal, 'Outb' (similarly shown as 'Out' with a line above) emerges from the common drain connection of transistors M6 and M10, and the non-inverting output signal 'Out' emerges from the common drain of transistors M7 and M11.

These nodes, Out and Outb, feedback to the bias control devices formed by transistors M2, M3, M4, and M5 and transistors M12, M13, M14, and M15 (the latter referred to as subcircuit 1502 in FIG. 15), which are equivalent to the current source I1 in circuit 100 of FIG. 1. The bias control is insensitive to the normal mode output voltage (i.e., the voltage difference between Out and Outb) but responds to the common mode output voltage (the average of the voltages on Out and Outb).

It will be seen that as illustrated here, transistors M10 to M15 are NMOS FETs, while transistors M2 to M7 are PMOS FETs, and form a mirror image of transistors M10 to M15. The transistors in circuit 1500 are operating with source-drain voltages that are below the source-gate voltages and no current other than that flowing through the input devices is consumed by the amplifier. Thus, circuit 1500 makes efficient use of the current when operating during the computation interval, which, as will be described below, is a small fraction of the time.

Circuit 1500 utilizes a control node K that can disconnect the transistors M2 through M15 from the power supply, DVcc. When the voltage on the node K is high, the PMOS device M1 is cut off and no current can flow from the power supply. The node K is also connected to transistors M8 and M9, which are NMOS devices. Consequently, when the power is disconnected by the signal on node K going high, the outputs are shorted to the inputs by transistors M8 and M9. This is done to prevent unknown voltages from being output to become inputs to the next circuit in a series.

Those of skill in the art will note that this connection of node K to both the shut down means, transistor M1, and the shorting means transistors M8 and M9, need not be direct as illustrated in FIG. 15. Two separate control lines, one for the shutdown and another for the shorting means, could be used; this would allow for differences in the timing of the two actions, which, in certain circumstances may be advantageous. For example, due to device parameter mismatches, which may be nominally fixed or variable with source-drain current, separate control of the power down and shorting means can reduce calculation errors.

This is because the improved speed-power product of this embodiment is achieved by reducing the amplifier current to zero and using the virtual ground configuration when in the active state (i.e. during the computation interval). The virtual ground configuration discussed below does not create a perfect virtual ground, as mismatches in threshold voltage may make it imprecise. As the amplifier is powered up to the active state this virtual ground error voltage may be stored on the capacitors (as described below), and is achieved by powering up the circuit first and then, after a short delay, removing the shorting means. This is an example in which separate control of power down means and shorting means can be advantageous.

One of skill in the art will appreciate that if the input common-mode voltage can be a fixed value, as it can by using capacitors surrounding the circuit 1500 as seen below, then the bias control device 1502 formed by transistors M12, M13, M14 and M15 may be omitted and the sources of M10 and M11 may be connected directly to the ground terminal DGnd.

Figure 16:
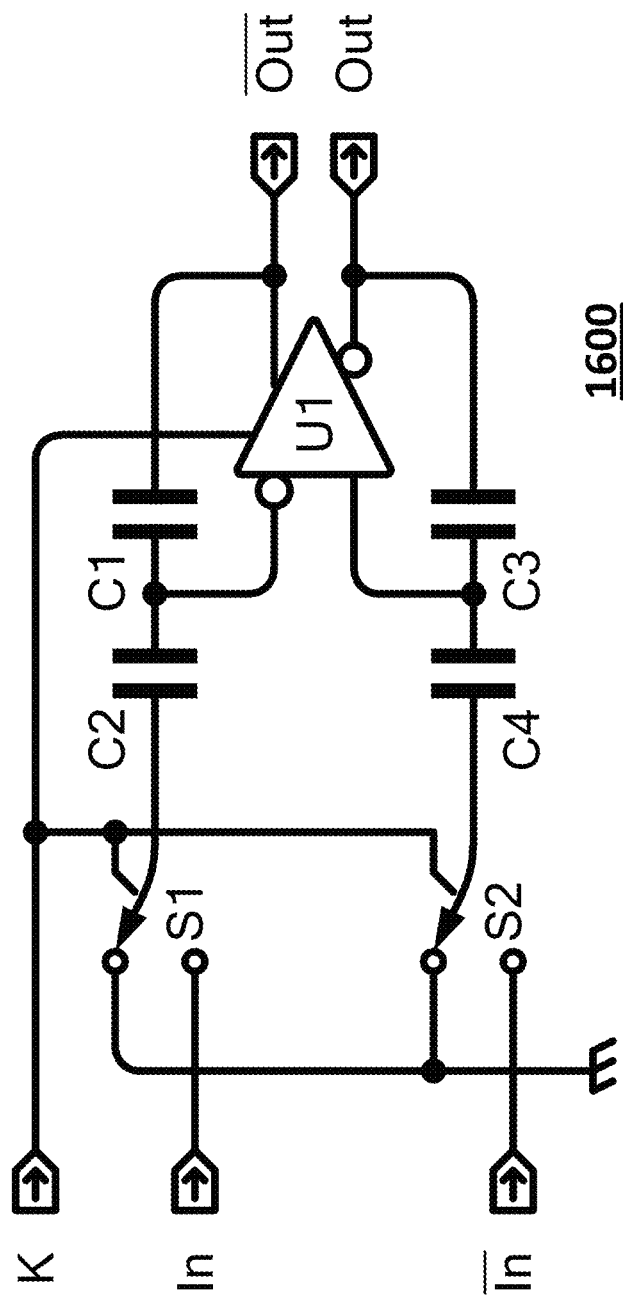
FIG. 16 is a circuit diagram of a circuit in which the differential circuit of FIG. 15 is used in an amplifier as an element of an analog computer according to one embodiment.

FIG. 16 shows a circuit 1600 in which the components of FIG. 15 are used as an amplifier U1 in the simplest configuration of an element of an analog computer making use of the present approach. One of skill in the art will recognize circuit 1600 as a virtual ground configuration, a configuration that is known in the art, with the exception of the specific implementation of the amplifier U1.

As discussed above with respect to circuit 1500 of FIG. 15, when the control signal on node K is high both the shut down means and the shorting means within amplifier U1 are active, and thus circuit 1600 is in a quiescent state. Capacitors C1 and C2 are shorted out by the internal shorting means of amplifier U1. Switches S1 and S2 connect capacitors C2 and C4 to the input signal nodes In and Inb. This state may persist as long as required; no calculation is taking place and no power is being consumed.

The computation interval begins when the control signal on node K is brought low. At that moment, power is applied to the gain elements within amplifier U1 and the shorting means is removed. (As mentioned above, this removal of the shorting means may be slightly delayed by the use of separate controls to the shorting and power down means. In that case there will be an interval where the offset voltages of the amplifier are stored across the capacitors C1 and C3. This is the "switched capacitor auto-zero" as would be understand by one of skill in the art.)

Concurrently with the providing of power to amplifier U1, switches S1 and S2 now connect the left-hand sides of capacitors C2 and C4 to ground (this is the switch configuration shown in FIG. 16, as is conventional in the art for a virtual ground configuration). Capacitors C2 and C4 have charge on them due to the time spent connected to the input signals In and Inb. This charge is transferred to capacitors C1 and C3 and appears as an output voltage. When this voltage appears, the computation interval is complete and the circuit may return to the quiescent state by driving the control signal on node K high again. Circuit 1600 of FIG. 16 is an example of one embodiment of the present approach, but by itself it may appear to achieve a seemingly trivial thing, i.e. it transfers, during the computation interval, the input voltage difference between In and Inb to the output terminals Out and Outb, possibly with a gain or attenuation as determined by the ratio of the capacitors, as is well known in the art. However, the action of circuit 1600 is nevertheless the basis of a potentially much more complex computation.

Figure 17:
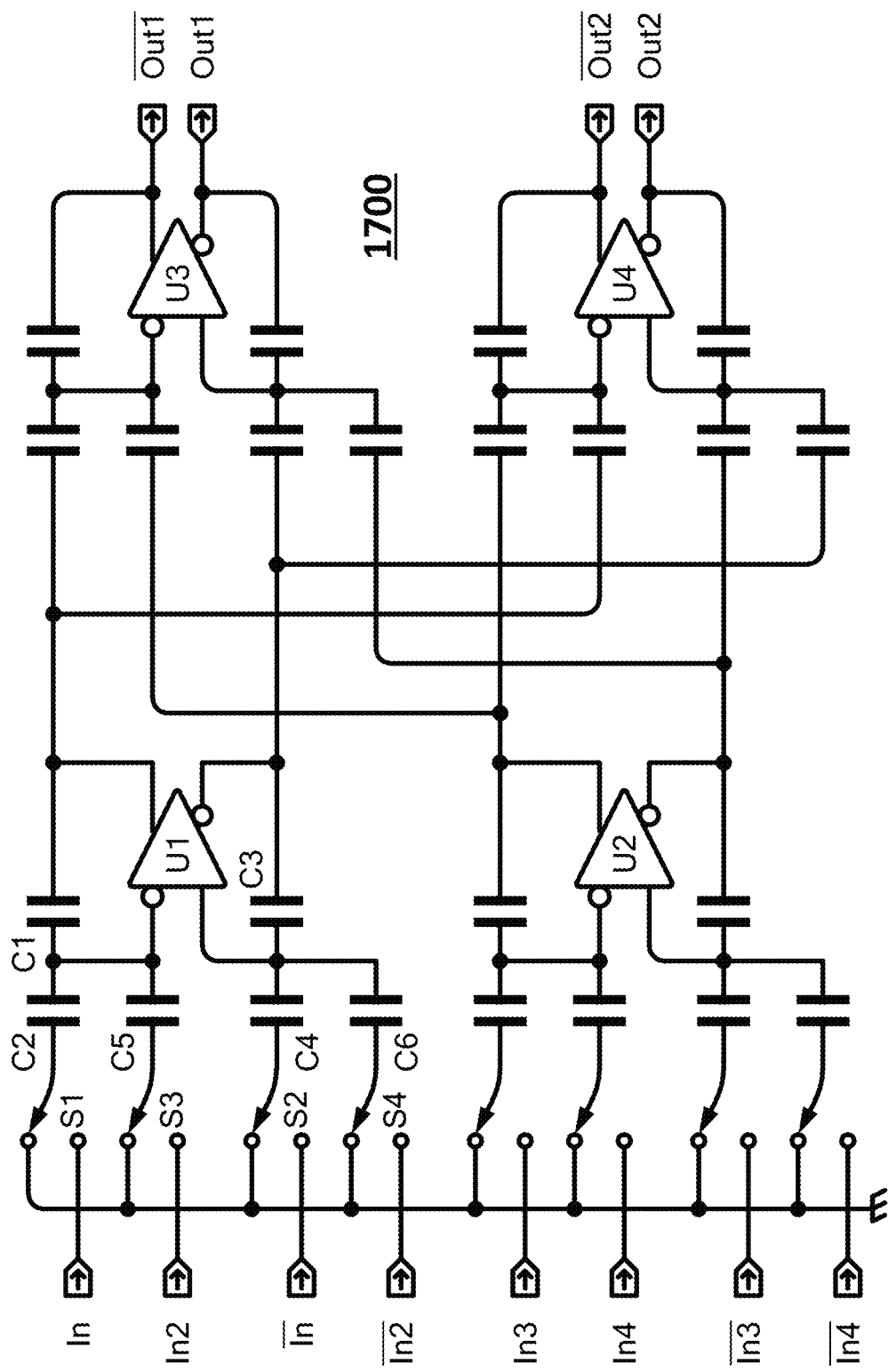
FIG. 17 is a circuit diagram of a circuit in which multiple instances of the circuit of FIG. 16 may be used to implement an analog computer according to one embodiment.

Circuit 1700 of FIG. 17 illustrates how multiple instances of circuit 1600 of FIG. 16 may be used to implement an analog computer capable of complex computation while retaining the described benefits of the present approach, i.e., faster speed and reduced power consumption.

One may regard circuit 1700 as being a two-dimensional array of multiple instances of circuit of circuit 1600 of FIG. 16. As illustrated in FIG. 17, circuit 1700 has four such instances, as indicated by the four amplifiers U1 to U4; again, each amplifier U1 to U4 contains an instance of circuit 1500 of FIG. 15. The four instances of circuit 1600 in circuit 1700 are arranged in a two-dimensional array having two rows and two columns, i.e., a first column with amplifiers U1 and U2 and a second column with amplifiers U3 and U4, and a first row with amplifiers U1 and U3 and a second row with amplifiers U2 and U4. In a given configuration, an array may have any desired number of such instances of circuit 1500, and thus may have any desired number of rows and columns.

Each amplifier U1 to U4 contains the shut-down and shorting means described with respect to circuit 1500 in FIG. 15 above, and all receive the same control signal discussed above. However, for ease of representation, the node K receiving the control signal and the signal lines supplying it to each amplifier U1 to U4 are not shown in circuit 1700.

Connecting a plurality of instances of circuit 1600 in this way allows for some changes in the implementation of each instance of circuit 1600. First, each amplifier in the first column, i.e., amplifiers U1 and U2, may receive different input signals. Further, multiple inputs to a single amplifier may be employed by adding capacitors between the multiple inputs and an amplifier; thus, for example, in addition to capacitors C2 and C4 as shown in FIG. 16, additional capacitors C5 and C6 allow additional inputs to amplifier U1, and, by selecting different values for the capacitors, also allow for those inputs to have different weights. The use of such additional capacitors may be applied to all of the amplifiers U1 to U4 as shown in FIG. 17; however, while FIG. 17 shows all of the amplifiers U1 to U4 having the same number of inputs, this is not required and in a given circuit each amplifier may have a different number of weighted inputs where appropriate.

In addition, where the inputs to an amplifier in the second column come from the outputs of an amplifier in the first column as shown in FIG. 17, the switches S1 and S2 are not needed in the second row, since the position of the switches connecting the first column of amplifiers U1 and U2 to the input signal are also operated by the control signal K as above.

One of skill in the art will appreciate that the column and row arrangement described herein and shown in the figure is similar to the arrangement of neurons in layers in a neural network. As with the first column in FIG. 17, the first layer of a neural network includes some number of switches that sample the input voltages, and subsequent layers connect to the outputs of prior layers directly. Because there can be an arbitrary number of inputs to a given amplifier, the connectivity between layers may be arbitrarily complex. Further, as with the differences in values of the capacitors in circuit 1700, the summation of voltages into each neuron in a neural network may be arbitrarily weighted.

Circuit 1700 of FIG. 17 is a simple circuit to show how the layers and connectivity used in a neural network may be made using the present approach with a plurality of the amplifiers of the type shown in circuit 1500 of FIG. 15. As a practical matter, a useful case of the present approach might have 4000 or more such amplifiers in each column or layer, and as many as 100 or more such layers. The connectivity between layers would be accomplished by the use of capacitors of different values to create the desired signal weightings.

When the global control signal is brought low as discussed above, the charges on the capacitors connected to the inputs, such as capacitors C2, C4, C5 and C6 in circuit 1700, are pushed into the amplifiers of the first layer, such as amplifiers U1 and U2 of circuit 1700. This causes the outputs of the first layer to push charge into the second layer, which in turn would push the output of the second layer into a third layer if one is present. This is the transient state that is the computation interval as previously described.

At a much more complex level than in FIG. 17 it will be seen that the computation interval is the time when the charges are flowing from the input to the various nodes of the network. The circuit of FIG. 17 and all such similar circuits may be considered as "charge redistribution networks" that are manipulating charges that are analogous to the problem that the network is designed to solve. The amplifiers need only remain active while this charge redistribution is taking place; once that activity subsides the voltages present at the network output (the output signal lines Out1 and Out2 of FIG. 17) may be sampled as known in the art and the control signal of the entire network may return to a high level, thus turning off the power as described above. Note that the output sampling may be done by a second instance of a complex network that uses the present approach. Thus, many such complex networks, each of them possibly containing thousands of the amplifier elements described in the present approach, may be cascaded.

One example of a problem that may be solved by a network as described above is the Fast Fourier Transform (FFT). Simulations have shown that a circuit containing just under 800 amplifier elements such as circuit 1500 of FIG. 15, and the associated capacitors of appropriate value, is able to calculate the FFT in significantly less than 1 nS, many times faster than a digital computer, and consuming typically one-thousandth of the power of the digital equivalent. This improvement in speed and power is the effect of the present approach.

One of skill in the art will note that the above description relates primarily to use in devices such as an analog computer where each amplifier element is identical, and the functionality is thus largely created by the use of different weighted elements surrounding the identical set of what has been described as an amplifier. However, there are other uses for the present approach.

Figure 18:
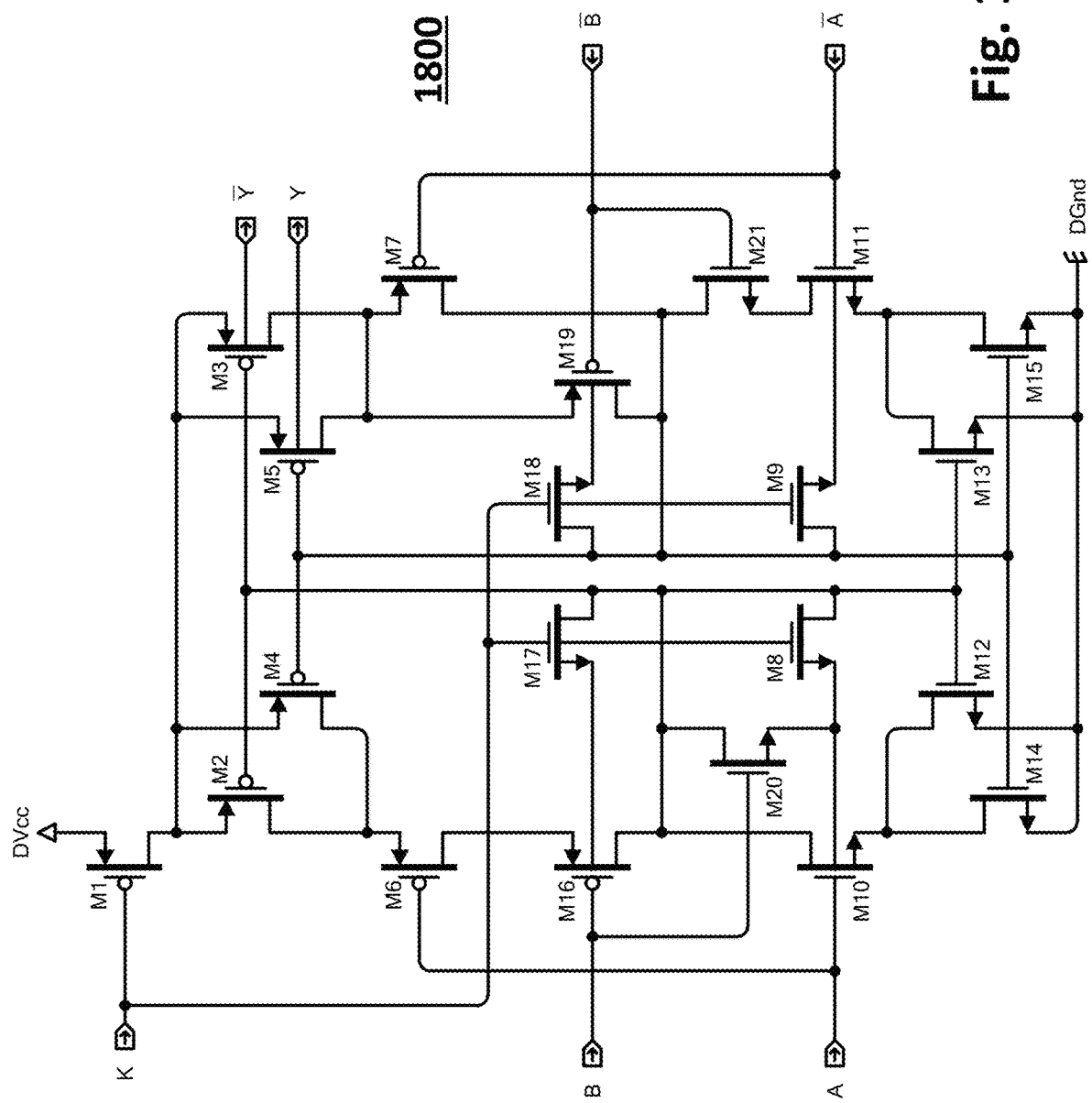
FIG. 18 is a circuit diagram of a circuit in which the amplifier of FIG. 15 may be turned into a two-input gate of any type according to one embodiment.

FIG. 18 is a circuit diagram of a circuit 1800 in which the amplifier of FIG. 15 may be turned into a two-input gate of any type by definition of which signal is to be considered the inverted signal, so that an AND, OR, NAND or NOR gate may all be constructed using the same circuit.

Circuit 1800 adds transistors M16 though M21. The inputs may now be considered as a logic signal, and the series/parallel arrangement of transistors M6, M16, M10 and M20 on one side and transistors M7, M19 M21 and M11 on the other side, create a two-input gate. This two-input gate may be duplicated numerous times and then be connected directly, without need of capacitors, to make a digital network as is well known in the art. Circuit 1800 is therefore similar to circuit 1300 in FIG. 13 in that it will run faster than the equivalent digital network; however, circuit 1800 will run at lower power, unlike circuit 1300 which, consumes more power than can be achieved by the known art.

One of skill in the art may wonder if the increase in speed resulting from use of the described method as shown in FIG. 12 is significant enough to justify the additional complexity and circuitry needed to change the gain of the circuits as explained above.

However, as above, in some embodiments reducing the gain of the amplifier circuits also reduces the power consumption (although this is not true in circuit 1002 of FIG. 10, because the current in the amplifier U1 is not reduced by shorting out resistor R1 of circuit 1002). In the discussion of FIG. 6 above, it was noted that operation using the present approach would in that case result in a reduction of power consumption of nearly 75%.

Consider also the application of the present approach to calculation of the Fourier transform of a signal. The rate of repetition of the Fourier transform needed may be, for example, a million calculations per second. However, it may take only 10 nS or less to perform each such calculation. Thus, the gain elements need only be active, with the higher power required, for about 1% of the time. In such situations, the full benefit of the present approach is seen, since operation is faster, generally faster than even a few logic gates, and much lower power is used since high power is only needed during the actual calculations.

Figure 19:
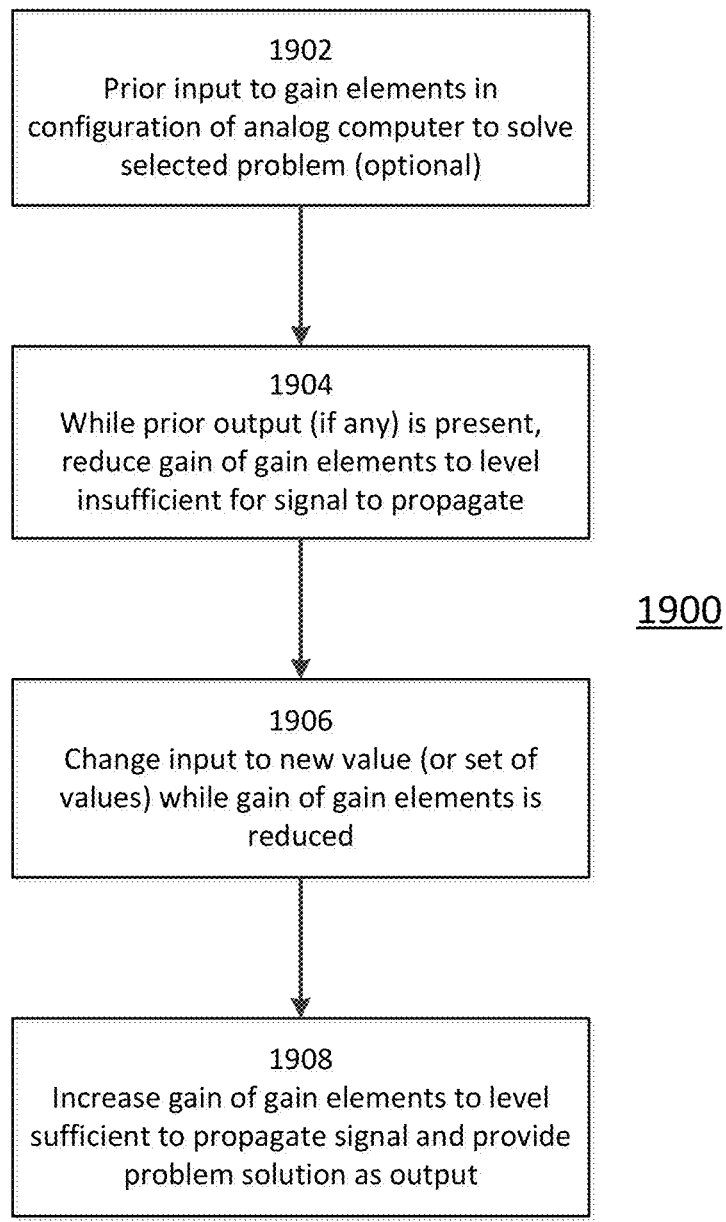
FIG. 19 is a flowchart of a method of operating an analog computer according to one embodiment of the present approach.

FIG. 19 is a flowchart of a method 1900 of operating an analog computer according to one embodiment of the present approach as described above.

At optional step 1902, an input is applied to a plurality of gain elements having variable gain, such as the circuits 100 and 1002 above, which are placed in the appropriate circuit configuration of an analog computer to solve a predetermined, desired problem. For example, the gain elements may be of the type shown as circuit 100 in FIG. 1, with the addition of circuitry for reducing the current from current source I1, or as circuit 1002 of FIG. 10. The gain elements may form a neural network as shown in FIG. 6, or may be placed in a different configuration to perform a Fourier transform or other operation. Step 1902 is considered optional since in cases in which an input is first applied to the analog computer, there will be no prior input.

At step 1904, while a prior output of the circuit (if any) is present, the gain of the gain elements is reduced to a level that is low enough that the input signal cannot propagate through the circuit. As above, this can be accomplished in circuit 100 of FIG. 1 by reducing the current through current source I1, or by closing switch S1 in circuit 1002 of FIG. 10.

At step 1906, the input signal is changed to a new value, or set of values, while the gain of the gain elements remains reduced.

Finally, at step 1908, the gain of the gain elements is increased to a level that is high enough to allow the input signal to propagate through the circuit, resulting in an output that is a solution to the problem represented by the analog computer. In reverse to the reduction of gain in step 1904, this can be accomplished in circuit 100 of FIG. 1 by increasing the current through current source I1, or by opening switch S1 in circuit 1002 of FIG. 10.

As above, in some embodiments the gain of the gain elements may be increased simultaneously with the change in the input signal, rather than being increased after the change in the input signal.

According to the present approach, it is possible to construct an analog computer from a series of gain elements with faster operation and lower power consumption than with the prior art. One of skill in the art will appreciate, in light of the teachings herein, that an analog computer may be constructed according to these principles.

The disclosed system and method has been explained above with reference to several embodiments. Other embodiments will be apparent to those skilled in the art in light of this disclosure. Certain aspects of the described method and apparatus may readily be implemented using configurations other than those described in the embodiments above, or in conjunction with elements other than or in addition to those described above.

For example, as is well understood by those of skill in the art, various choices will be apparent to those of skill in the art. Further, the illustration of transistors, other circuitry, and the associated feedback loops, resistors, etc., is exemplary; one of skill in the art will be able to select the appropriate number of transistors and related elements that is appropriate for a particular application.

These and other variations upon the embodiments are intended to be covered by the present disclosure, which is limited only by the appended claims.

What is claimed is:

1. A method of operating an analog computer, the analog computer comprising a plurality of gain elements configured to operate on an overall input signal to provide a solution to a predetermined problem, the gain of each of the plurality of gain elements being variable between a level sufficient to propagate a signal input to the element and a level insufficient to propagate the signal input to the element, the method comprising:
    reducing the gain of each of the plurality of gain elements to the level that is insufficient to propagate the signal input to the gain elements;
    changing the overall input signal while the gain of the gain elements is at the reduced level; and
    increasing the gain of each of the plurality of gain elements, at a time not before the changing of the input signal, to the level that is sufficient to propagate the signal input to the gain elements.

2. The method of claim 1 wherein the time of increasing the gain of the gain elements is after the changing of the overall input signal.

3. The method of claim 1 wherein the time of increasing the gain of the gain elements is simultaneous with the changing of the overall input signal.

4. A variable gain element for use in an analog computer, comprising:
    first and second transistors, each transistor having a gate, a source and a drain, the gate of the first transistor configured to receive an input signal and the gate of the second transistor connected to a reference point;
    first and second resistors, the first resistor connected to the drain of the first transistor and to one side of a voltage source, and the second resistor connected to the drain of the second transistor and to the voltage source;
    a current source connected to the sources of both the first and second transistors, configured to provide different levels of current in response to a control signal;
    an amplifier having inputs connected to the drains of the first and second transistors and the reference point, and an output configured to provide the output of the gain element; and
    a control circuit configured to provide a control signal based upon a pre-selected condition, wherein the control circuit further comprises:
        a switch; and
        control logic for placing the switch in a first position when there is a change in the input signal and a second position when there is a change in the output of the gain element; and
        wherein the current source is configured to provide current when the switch is in the first position and to provide no current when the switch is in the second position.

5. The variable gain element of claim 4 wherein the first and second transistors are n-type metal oxide semiconductor field effect transistors.

6. A variable gain element for use in an analog computer, comprising:
    first and second transistors, each transistor having a gate, a source and a drain, the gate of the first transistor configured to receive an input signal and the gate of the second transistor connected to a reference point;
    first and second resistors, the first resistor connected to the drain of the first transistor and to one side of a voltage source, and the second resistor connected to the drain of the second transistor and to the voltage source;
    a current source connected to the sources of both the first and second transistors, configured to provide different levels of current in response to a control signal;
    an amplifier having inputs connected to the drains of the first and second transistors and the reference point, and an output configured to provide the output of the gain element; and
    a control circuit configured to provide a control signal based upon a pre-selected condition, wherein the control circuit further comprises:
        a switch; and
        control logic for placing the switch in a first position and a second position at pre-selected intervals.

7. A variable gain element for use in an analog computer, comprising:
    a first amplifier configured to receive a signal at a first end and produce an amplified signal at a second end;

a first resistive element having a first end configured to receive an input signal to the variable gain element, and a second end connected to the first end of the first amplifier;

a second resistive element having a first end connected to the first end of the first amplifier and a second end connected to the second end of the first amplifier;

a switch having a first end connected to the first end of the first amplifier, a second end connected to the second end of the first amplifier, and a switch port configured to receive a control signal, the switch being in either an open position or a closed position depending upon a control signal;

control logic configured to provide the control signal to open or close the switch based upon a pre-selected condition;

a second amplifier configured to receive a signal at a first end and produce an amplified signal at a second end, the first end of the second amplifier connected to the second end of the first amplifier and the second end of the second amplifier configured to produce an output signal from the variable gain element; and wherein the pre-selected condition is to change the position of the switch when the input changes and again when an output signal appears on the output port of the second amplifier.

8. A variable gain element for use in an analog computer, comprising:

a first amplifier configured to receive a signal at a first end and produce an amplified signal at a second end;

a first resistive element having a first end configured to receive an input signal to the variable gain element, and a second end connected to the first end of the first amplifier;

a second resistive element having a first end connected to the first end of the first amplifier and a second end connected to the second end of the first amplifier;

a switch having a first end connected to the first end of the first amplifier, a second end connected to the second end of the first amplifier, and a switch port configured to receive a control signal, the switch being in either an open position or a closed position depending upon a control signal;

control logic configured to provide the control signal to open or close the switch based upon a pre-selected condition;

a second amplifier configured to receive a signal at a first end and produce an amplified signal at a second end, the first end of the second amplifier connected to the second end of the first amplifier and the second end of the second amplifier configured to produce an output signal from the variable gain element; and wherein the pre-selected condition is to change the position of the switch at pre-selected intervals.

9. An analog computer comprising:

a plurality of gain elements configured to operate on an overall input signal to provide a solution to a predetermined problem, the gain of each gain element being variable between a level sufficient to propagate a signal input to the element and a level insufficient to propagate the input signal;

a gain control means configured to switch the gain of the gain elements between the level sufficient to propagate the input signal and the level insufficient to propagate the input signal based upon a control signal; and a logic means configured to generate control signals causing the gain control means to switch the gain of the gain elements to the level insufficient to propagate the input signal before a change in the overall input signal, and to the level sufficient to propagate the input signal at a time not before the change in the input signal.

10. The analog computer of claim 9 wherein the gain elements contain transistors and the gain control means is a current source that reduces the current in the transistors below the point at which the transistors conduct current.

11. The analog computer of claim 9 wherein the gain elements include resistive feedback loops and the gain control means is a switch that shorts a feedback resistor and causes the gain of the gain element to drop to approximately zero.

12. The variable gain element of claim 6 wherein the first and second transistors are n-type metal oxide semiconductor field effect transistors.

* * * * *